(12) United States Patent
Ding et al.

(10) Patent No.: US 12,433,109 B2
(45) Date of Patent: Sep. 30, 2025

(54) DISPLAY SUBSTRATE, PREPARATION METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Xiaoqi Ding, Beijing (CN); Peng Huang, Beijing (CN); Ke Liu, Beijing (CN); Tao Gao, Beijing (CN); Xinlei Yang, Beijing (CN); Guoyi Cui, Beijing (CN); Zeliang Li, Beijing (CN); Hui Lu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 88 days.

(21) Appl. No.: 17/637,456

(22) PCT Filed: Apr. 28, 2021

(86) PCT No.: PCT/CN2021/090398
§ 371 (c)(1),
(2) Date: Nov. 3, 2022

(87) PCT Pub. No.: WO2022/226815
PCT Pub. Date: Nov. 3, 2022

(65) Prior Publication Data
US 2024/0121997 A1    Apr. 11, 2024

(51) Int. Cl.
*H10K 59/124* (2023.01)
*H10K 59/12* (2023.01)
(Continued)

(52) U.S. Cl.
CPC ....... *H10K 59/124* (2023.02); *H10K 59/1201* (2023.02); *H10K 59/1213* (2023.02); *H10K 59/8731* (2023.02)

(58) Field of Classification Search
CPC ........... H10K 59/1201; H10K 59/1213; H10K 59/1216; H10K 59/123; H10K 59/124;
(Continued)

(56) References Cited

U.S. PATENT DOCUMENTS

2010/0127270 A1    5/2010    Yan et al.
2013/0126915 A1    5/2013    Chan et al.
(Continued)

FOREIGN PATENT DOCUMENTS

CN    102522421 A    6/2012
CN    107658333 A    2/2018
(Continued)

OTHER PUBLICATIONS

European Search Report for 21938301.5 Mailed Nov. 24, 2023.

*Primary Examiner* — Brigitte A Paterson
(74) *Attorney, Agent, or Firm* — Ling Wu; Stephen Yang; Ling and Yang Intellectual Property

(57) ABSTRACT

Provided are a display substrate, a preparation method thereof and a display apparatus. The display substrate includes a first semi-conductive layer, a first conductive layer, a second conductive layer, a second semi-conductive layer, a third conductive layer, an interlayer insulating layer and an organic layer stacked on a substrate. The first semi-conductive layer includes an active layer of a polysilicon transistor, the first conductive layer includes a gate electrode of a polysilicon transistor and a first electrode plate of a storage capacitor, the second conductive layer includes a second electrode plate of a storage capacitor, the second semi-conductive layer includes an active layer of an oxide
(Continued)

transistor, and the third conductive layer includes a gate electrode of an oxide transistor.

19 Claims, 17 Drawing Sheets

(51) Int. Cl.
  *H10K 59/121* (2023.01)
  *H10K 59/80* (2023.01)
(58) Field of Classification Search
  CPC ............ H10K 59/9731; H10D 86/423; H10D 86/451; H10D 86/481; H10D 86/60
  See application file for complete search history.

(56) References Cited

U.S. PATENT DOCUMENTS

| | | | |
|---|---|---|---|
| 2014/0346473 A1 | 11/2014 | Park et al. | |
| 2016/0300859 A1 | 10/2016 | Moon et al. | |
| 2019/0115407 A1 | 4/2019 | Cho et al. | |
| 2019/0131368 A1 | 5/2019 | Zhang et al. | |
| 2020/0357829 A1 | 11/2020 | Yang et al. | |
| 2021/0005644 A1 | 1/2021 | Song et al. | |
| 2021/0013280 A1 | 1/2021 | Choi et al. | |
| 2021/0074785 A1 | 3/2021 | Kim et al. | |
| 2021/0134917 A1* | 5/2021 | Li | G09G 3/3275 |
| 2021/0174739 A1 | 6/2021 | Lu et al. | |
| 2021/0210560 A1 | 7/2021 | Tian et al. | |
| 2021/0249449 A1 | 8/2021 | Cai et al. | |

FOREIGN PATENT DOCUMENTS

| | | |
|---|---|---|
| CN | 107958924 A | 4/2018 |
| CN | 108376672 A | 8/2018 |
| CN | 109801954 A | 5/2019 |
| CN | 110299322 A | 10/2019 |
| CN | 110910825 A | 3/2020 |
| CN | 111785759 A | 10/2020 |
| CN | 112002702 A | 11/2020 |
| CN | 112216727 A | 1/2021 |
| CN | 112234091 A | 1/2021 |
| CN | 112331679 A | 2/2021 |
| CN | 112331681 A | 2/2021 |
| CN | 112466907 A | 3/2021 |

* cited by examiner

DISPLAY SUBSTRATE, PREPARATION METHOD THEREOF, AND DISPLAY APPARATUS

CROSS-REFERENCE TO RELATED APPLICATIONS

The present application is a U.S. National Phase Entry of International Application No. PCT/CN2021/090398 having an international filing date of Apr. 28, 2021. The above-identified application is incorporated into the present application by reference.

TECHNICAL FIELD

Embodiments of the present disclosure relate to, but are not limited to, the field of display technologies, and particularly relates to a display substrate, a preparation method thereof, and a display apparatus.

BACKGROUND

An Organic Light Emitting Diode (OLED) is an active emitting display device, which has the advantages of self-luminescence, wide angle of view, high contrast, low power consumption, extremely high response speed and so on. With the constant development of a display technology, a display apparatus that uses an OLED as an emitting element and a Thin Film Transistor (TFT) for signal control has become a mainstream product in the field of display at present.

SUMMARY

The following is a summary about the subject matter described in the present disclosure in detail. The summary is not intended to limit the scope of protection of the claims.

An embodiment of the disclosure provides a display substrate, in a plane perpendicular to the display substrate, the display substrate includes a substrate and a first semi-conductive layer, a first conductive layer, a second conductive layer, a second semi-conductive layer, a third conductive layer, an interlayer insulating layer and an organic layer stacked on the substrate;

the first semi-conductive layer includes an active layer of at least one polysilicon transistor, the first conductive layer includes a gate electrode of at least one polysilicon transistor and a first plate of a storage capacitor, the second conductive layer includes a second plate of a storage capacitor, the second semi-conductive layer includes an active layer of at least one oxide transistor, and the third conductive layer includes a gate electrode of at least one oxide transistor; and the interlayer insulating layer is provided with a plurality of vias and grooves, there is at least an overlapping region between the orthographic projection of the vias on the substrate and the orthographic projection of at least one of the first semi-conductive layer, the first conductive layer, the second conductive layer, the second semi-conductive layer and the third conductive layer on the substrate, and the organic layer fills the plurality of grooves.

In an exemplary embodiment, there is at least a non-overlapping region between the orthographic projection of the plurality of grooves on the substrate and the orthographic projection of the gate electrode of the oxide transistor on the substrate.

In an exemplary embodiment, the plurality of grooves include a second groove; there is at least a non-overlapping region between the orthographic projection of the second groove on the substrate and the orthographic projection of the first semi-conductive layer on the substrate; and there is at least a non-overlapping region between the orthographic projection of the second groove on the substrate and the orthographic projection of the second semi-conductive layer on the substrate.

In an exemplary embodiment, the polysilicon transistor includes a first transistor, a second transistor, a third transistor, a fourth transistor, a fifth transistor, a sixth transistor and a seventh transistor, and the oxide transistor includes an eighth transistor; the display substrate includes a plurality of sub-pixels, wherein the sub-pixels include a first region, a second region and a third region, and the second region is disposed between the first region and the third region; the first transistor, the second transistor, the fourth transistor and the eighth transistor are disposed in the first region; the third transistor and the storage capacitor are disposed in the second region; and the fifth transistor, the sixth transistor and the seventh transistor are disposed in the third region.

In an exemplary embodiment, the plurality of vias include a first via, a second via, a third via, a fourth via, a fifth via, a sixth via, a seventh via and an eighth via; a second plate of the storage capacitor includes an opening, and an orthographic projection of the first via on the substrate is within the range of an orthographic projection of the opening on the substrate, and there is at least an overlapping region between the orthographic projection of the first via on the substrate and the orthographic projection of the first electrode plate on the substrate; an orthographic projection of the second via on the substrate is within the range of an orthographic projection of the second electrode plate on the substrate, and there is at least an overlapping region between the orthographic projection of the second via on the substrate and the orthographic projection of the second electrode plate on the substrate; there is at least an overlapping region between the orthographic projection of the third via on the substrate and the orthographic projection of the first electrode of the fifth transistor on the substrate; there is at least an overlapping region between the orthographic projection of the fourth via on the substrate and the orthographic projection of the second electrode of the sixth transistor on the substrate; there is at least an overlapping region between the orthographic projection of the fifth via on the substrate and the orthographic projection of the first electrode of the fourth transistor on the substrate; there is at least an overlapping region between the orthographic projection of the sixth via on the substrate and the orthographic projection of the first electrode of the second transistor on the substrate; there is at least an overlapping region between the orthographic projection of the seventh via on the substrate and the orthographic projection of the first electrode of the seventh transistor on the substrate; and there is at least an overlapping region between the orthographic projection of the eighth via on the substrate and the orthographic projection of the first electrode of the first transistor on the substrate.

In an exemplary embodiment, the plurality of grooves include a fourth groove; the fourth groove is disposed in the second region, and there is at least an overlapping region between the orthographic projection of the fourth groove on the substrate and the orthographic projection of the active layer of the fourth transistor on the substrate; and there is at least an overlapping region between the orthographic projection of the fourth groove on the substrate and the orthographic projection of the second electrode plate on the substrate.

In an exemplary embodiment, the first conductive layer includes a first scanning signal line, a second scanning signal line, an light emitting control line and a first plate of a storage capacitor, and the second conductive layer includes a first shielding layer, a second plate of the storage capacitor and a plate connecting line; the third conductive layer includes a third scanning signal line and a second initial signal line; the first scanning signal line, the third scanning signal line and the second initial signal line extend along a first direction and are disposed in the first region; the first electrode plate, the second electrode plate and the plate connecting line of the storage capacitor are all disposed in the second region; and the second scanning signal line, the light emitting control line and the first shielding layer all extend along the first direction and are disposed in the third region.

In an exemplary embodiment, the plurality of vias include a ninth via, a tenth via and an eleventh via; there is at least an overlapping region between the orthographic projection of the ninth via on the substrate and the orthographic projection of the second initial signal line on the substrate; there is at least an overlapping region between the orthographic projection of the tenth via on the substrate and the orthographic projection of the first electrode of the eighth transistor on the substrate; and there is at least an overlapping region between the orthographic projection of the eleventh via on the substrate and the orthographic projection of the second electrode of the eighth transistor on the substrate.

In an exemplary embodiment, the plurality of grooves include a third groove; the third groove is disposed in the second region, and there is at least an overlapping region between the orthographic projection of the third groove on the substrate and the orthographic projection of the active layer of the third transistor on the substrate; and there is at least an overlapping region between the orthographic projection of the third groove on the substrate and the orthographic projections of the second plate and the plate connecting line on the substrate.

In an exemplary embodiment, the third groove is further disposed in the third region, and there is at least an overlapping region between the orthographic projection of the third groove on the substrate and the orthographic projection of the active layer of the sixth transistor on the substrate; and there is at least an overlapping region between the orthographic projection of the third groove on the substrate and the orthographic projection of the light emitting control line on the substrate.

In an exemplary embodiment, there is at least an overlapping region between the orthographic projection of the third groove on the substrate and the orthographic projection of the active layer of the seventh transistor on the substrate; and there is at least an overlapping region between the orthographic projection of the third groove on the substrate and the orthographic projection of the second scanning signal line on the substrate.

In an exemplary embodiment, the plurality of grooves include a fifth groove; the fifth groove is disposed in the third region, and there is at least an overlapping region between the orthographic projection of the fifth groove on the substrate and the orthographic projection of the active layer of the fifth transistor on the substrate; and there is at least an overlapping region between the orthographic projection of the fifth groove on the substrate and the orthographic projection of the light emitting control line on the substrate.

In an exemplary embodiment, the plurality of grooves include a sixth groove; and there is at least an overlapping region between the orthographic projection of the sixth groove on the substrate and the orthographic projection of the second scanning signal line on the substrate.

In an exemplary embodiment, the plurality of grooves include a seventh groove; and there is at least an overlapping region between the orthographic projection of the seventh groove on the substrate and the orthographic projections of the first scanning signal line and the light emitting control line on the substrate.

In an exemplary embodiment, the plurality of grooves include an eighth groove; the eighth groove is disposed in the third region, and there is at least a non-overlapping region between the orthographic projection of the eighth groove on the substrate and the orthographic projection of the first semi-conductive layer on the substrate; there is at least an overlapping region between the orthographic projection of the eighth groove on the substrate and the orthographic projection of the light emitting control line on the substrate; and there is at least an overlapping region between the orthographic projection of the eighth groove on the substrate and the orthographic projection of the second scanning line on the substrate.

In an exemplary embodiment, the plurality of grooves include a thirteenth groove; and the thirteenth groove is disposed in the third region, and there is at least an overlapping region between the orthographic projection of the thirteenth groove on the substrate and the orthographic projection of the eighth groove on the substrate.

In an exemplary embodiment, the display substrate further includes a fourth conductive layer disposed on the organic layer, wherein the fourth conductive layer includes a power connecting line, a first initial signal line, a fifth connection electrode, a sixth connection electrode, a seventh connection electrode, an eighth connection electrode and a ninth connection electrode; a gate electrode of the first transistor is connected with the second scanning signal line, a first electrode of the first transistor is connected with a second initial signal line through the ninth connection electrode and a via, and a second electrode of the first transistor and a first electrode of the second transistor are connected with a first electrode of an eighth transistor through the sixth connection electrode and a via; a gate electrode of the second transistor is connected with a first scanning signal line; a first plate of a storage capacitor and a gate electrode of a third transistor are connected with a second electrode of an eighth transistor through the fifth connection electrode and a via, and a second plate of the storage capacitor is connected with a first power supply line through a power connecting line; a first electrode of the third transistor, a second electrode of the fourth transistor and a second electrode of the fifth transistor are connected into an integrated structure, and a second electrode of a third transistor, a second electrode of a second transistor and a first electrode of a sixth transistor are connected into an integrated structure; a gate electrode of the fourth transistor is connected with a first scanning signal line, and a first electrode of the fourth transistor is connected with a data signal line through the eighth connection electrode and a via; a gate electrode of the fifth transistor is connected with an light emitting control signal line, and a first electrode of the fifth transistor is connected with a first power supply line; a gate electrode of the sixth transistor is connected with an light emitting control signal line, and a second electrode of the sixth transistor and a second electrode of a seventh transistor are mutually connected through a seventh connection electrode and a via; a gate electrode of the seventh transistor is connected with a first scanning signal line, and a first electrode of the seventh transistor is connected with a first initial signal line; and a gate electrode of the eighth transistor is connected with a third scanning signal line.

In an exemplary embodiment, the plurality of grooves include a ninth groove; the ninth groove is disposed in a first region, and there is at least an overlapping region between the orthographic projection of the ninth groove on the substrate and the orthographic projection of the second initial signal line on the substrate.

In an exemplary embodiment, the plurality of grooves include an eleventh groove and a twelfth groove; the eleventh groove and the twelfth groove are both disposed in the first region, and are respectively located at two sides of the eighth transistor along a first direction, and there is at least an overlapping region between the orthographic projections of the eleventh groove and the twelfth groove on the substrate and the orthographic projection of the third scanning signal line on the substrate.

In an exemplary embodiment, the display substrate further includes a light shielding layer and a third insulating layer, wherein the light shielding layer is disposed between the substrate and the first semi-conductive layer, the third insulating layer is disposed between the first conductive layer and the second conductive layer, and the third insulating layer includes a sinking groove; there is at least an overlapping region between the orthographic projection of the sinking groove on the substrate and the orthographic projection of the light shielding layer on the substrate; and there is at least an overlapping region between the orthographic projection of the sinking groove on the substrate and the orthographic projection of the active layer of the oxide transistor on the substrate.

In an exemplary embodiment, the organic layer is a flexible organic layer.

An embodiment of the present disclosure further provides a display apparatus, including the display substrate as described in any one of the above.

An embodiment of the present disclosure also provides a preparation method for a display substrate, including: forming a first semi-conductive layer on a substrate, wherein the first semi-conductive layer includes an active layer of at least one polysilicon transistor; forming a first conductive layer on the first semi-conductive layer, wherein the first conductive layer includes a gate electrode of at least a polysilicon transistor and a first electrode plate of a storage capacitor; forming a second conductive layer on the first conductive layer, wherein the second conductive layer includes a second electrode plate of a storage capacitor; forming a second semi-conductive layer on the second conductive layer, wherein the second semi-conductive layer includes an active layer of at least one oxide transistor; forming a third conductive layer on the second semi-conductive layer, wherein the third conductive layer includes a gate electrode of at least one oxide transistor; and sequentially forming an interlayer insulating layer and an organic layer on the third conductive layer, wherein the interlayer insulating layer is provided with a plurality of vias and grooves, there is at least an overlapping region between the orthographic projection of the vias on the substrate and the orthographic projection of at least one of the first semi-conductive layer, the first conductive layer, the second conductive layer, the second semi-conductive layer and the third conductive layer on the substrate, and the organic layer fills the plurality of grooves.

After the drawings and the detailed descriptions are read and understood, the other aspects may be comprehended.

BRIEF DESCRIPTION OF DRAWINGS

The drawings provide a further understanding to the technical solution of the present disclosure, form a part of the specification, and are adopted to explain, together with the embodiments of the present disclosure, the technical solutions of the present disclosure and not intended to form limits to the technical solutions of the present disclosure. The shapes and sizes of each component in the drawings do not reflect the true scale, and are only intended to schematically describe the contents of the present disclosure.

DETAILED DESCRIPTION

Figure 1:
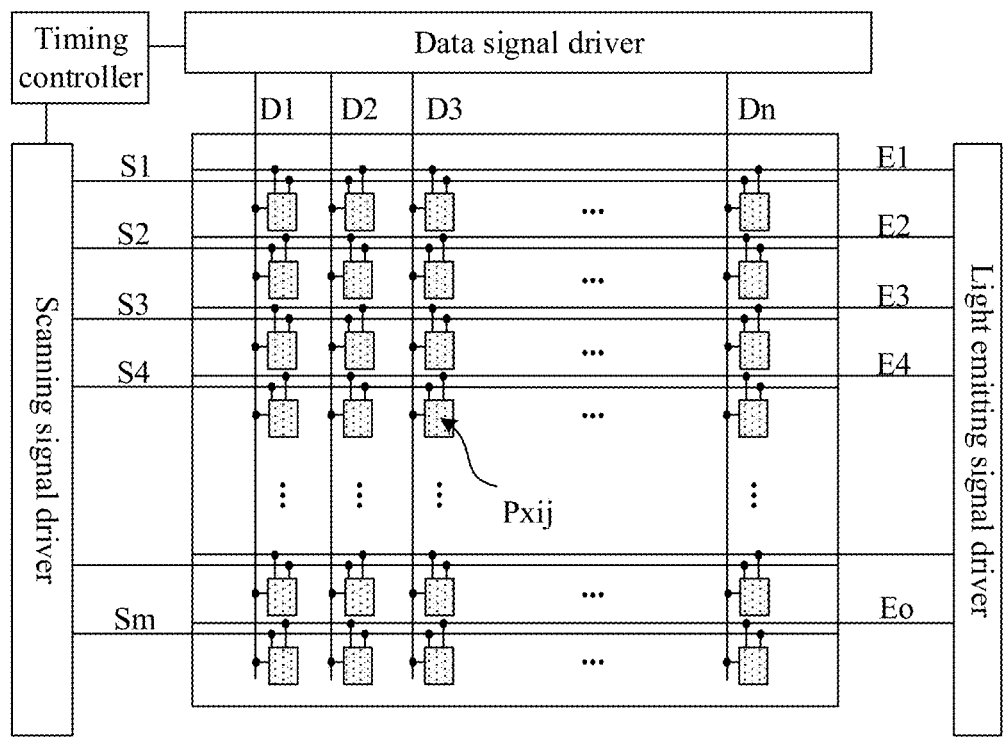
FIG. 1 is a schematic diagram of a structure of a display apparatus.

To make the objects, technical solutions and advantages of the present disclosure more clear, embodiments of the present disclosure will be described in detail below with reference to the drawings. It is to be noted that implementations may be implemented in various forms. Those of ordinary skill in the art can easily understand such a fact that manners and contents may be transformed into various forms without departing from the purpose and scope of the present disclosure. Therefore, the present disclosure should not be explained as being limited to the contents recorded in the following implementations only. The embodiments in the present disclosure and the features in the embodiments can be freely combined if without conflicts. For keeping the following description of the embodiments of the disclosure clear and concise, detailed descriptions about part of known functions and known components are omitted in the disclosure. The accompanying drawings of the embodiments of the present disclosure only involve the structures involved in the embodiments of the present disclosure, and the other structures may refer to conventional designs.

In the drawings, sometimes for clarity, the size of the constituent elements, the thickness of the layer or the area may be exaggerated. Therefore, a mode of the present disclosure is not always limited to the size and the shapes and sizes of each component in the drawings do not reflect the true scale. In addition, the drawings schematically illustrate ideal examples, and a mode of the present disclosure is not limited to the shapes, numerical values, or the like shown in the drawings.

"First", "second", "third" and other ordinal numerals in the specification are set to avoid the confusion of the constituent elements, rather than to limit the quantity.

For convenience, in the specification the terms such as "middle", "up", "down", "front", "back", "vertical", "horizontal", "top", "bottom", "inside" and "outside" indicating the orientation or position relationship are used to describe the position relationship between the constituent elements with reference to the drawings, only for the convenience of describing the specification and simplifying the description, instead of indicating or implying that the device or element referred to must have a specific orientation or be constructed and operated in a specific orientation, so they should not be understood as limitations to the present disclosure. The position relationship between the constituent elements may be appropriately varied according to the direction describing constituent elements. Therefore, appropriate replacements based on situations are allowed, not limited to the expressions in the specification.

Unless otherwise specified and limited, in the specification the terms "mount", "connected" and "connect" should be understood in a broad sense. For example, it may be fixed connection, removable connection, or integrated connection; it may be mechanical connection or electrical connection; it may be direct connection, indirect connection through an intermediate component, or communication inside two components. For those skilled in the art, the specific meanings of the above terms in the present disclosure can be understood according to the actual situation.

In the specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the present specification, the channel region refers to a main region that the current flows through.

In the present specification, the first electrode may be the drain electrode, and the second electrode may be the source electrode. Alternatively, the first electrode may be the source electrode, and the second electrode may be the drain electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchanged in the present specification.

In this specification, an "electrical connection" includes a case where constituent elements are connected together through an element with a certain electric action. "The element with the certain electric action" is not particularly limited as long as electric signals between the connected constituent elements may be sent and received. Examples of "the element with the certain electric action" not only include an electrode and wire, but also include a switch element (such as a transistor), a resistor, an inductor, a capacitor, other elements with various functions, etc.

In the specification, "parallel" refers to a state in which an angle formed by two straight lines is more than −10° and less than 10°. Thereby, it also includes a state in which an angle is more than −5° and less than 5°. In addition, "vertical" refers to a state in which an angle formed by two straight lines is more than 80° and less than 100°. Therefore, it also includes a state in which an angle is more than 85° and less than 95°.

In this specification, "thin film" and "layer" may be interchangeable. For example, sometimes "conducting layer" may be replaced by "conducting thin film". Similarly, sometimes "insulating thin film" may be replaced by "insulating layer".

In the present disclosure, "about" refers to that a boundary is defined not so strictly and numerical values in process and measurement error ranges are allowed.

FIG. 1 illustrates a schematic diagram of a structure of a display apparatus. As shown in FIG. 1, an OLED display apparatus may include a timing controller, a data signal driver, a scanning signal driver, an light emitting signal driver, and a pixel array. The pixel array may include a plurality of scanning signal lines (S1 to Sm), a plurality of data lines (D1 to Dn), a plurality of light emitting signal lines (E1 to Eo), and a plurality of sub-pixels (Pxij). In an exemplary implementation, a timing controller may provide a gray scale value and a control signal suitable for specifications of a data signal driver to the data signal driver, and may provide a clock signal, a scanning start signal, and the like suitable for specifications of a scanning signal driver to the scanning signal driver, and may provide a clock signal, an emitting stop signal, and the like suitable for specifications of an light emitting signal driver to the light emitting signal driver. The data signal driver may generate data voltages to be provided to data lines D1, D2, D3 . . . and Dn using the gray scale value and the control signal received from the timing controller. For example, the data signal driver may sample the gray-scale value using the clock signal and apply the data voltage corresponding to the gray-scale value to the data lines D1 to Dn taking sub-pixel row as the unit, where n may be a natural number. The scanning signal driver may generate scanning signals to be provided to scanning signal lines S1, S2, S3 . . . and Sm by receiving a clock signal, a scanning start signal, and the like from the timing controller. For example, the scanning signal driver may sequentially provide scanning signals with ON-level pulses to the scanning signal lines S1 to Sm. For example, the scanning signal driver may be constructed in a form of a shift register, and may generate scanning signals in such a way that the scanning start signals provided in a form of ON-level pulses are sequentially transmitted to a next-stage circuit under control of a clock signal, wherein m may be a natural number. The light emitting signal driver may generate transmission signals to be provided to light emitting signal lines E1, E2, E3, . . . , and Eo by receiving the clock signal, the transmission stop signal, and the like from the timing controller. For example, the light emitting signal driver may sequentially provide emitting signals with OFF-level pulses to the light emitting signal lines E1 to Eo. For example, the light emitting signal driver may be constructed in a form of a shift register, and may generate emitting signals in such a way that light emitting stop signals provided in a form of OFF-level pulses are sequentially transmitted to a next-stage circuit under control of a clock signal, wherein o may be a natural number. The pixel array may include a plurality of sub-pixels Pxij. Each sub-pixel Pxij may be connected to a corresponding data line, a corresponding scanning signal line, and a corresponding light emitting signal line, where i and j may be natural numbers. The sub-pixel Pxij may refer to a sub-pixel in which a transistor is connected to an ith scanning signal line as well as a jth data line.

Figure 2:
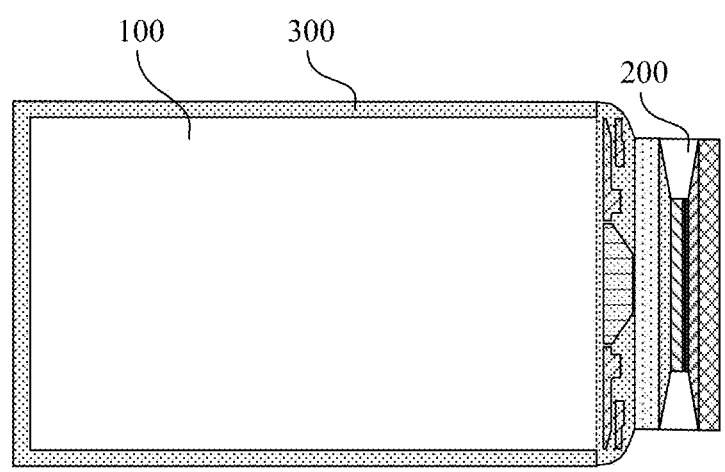
FIG. 2 is a schematic diagram of a planar structure of a display substrate.

FIG. 2 is a schematic diagram of a planar structure of a display substrate. As shown in FIG. 2, the display substrate may include a display region 100, a bonding region 200 on one side of the display region 100, and a bezel region 300 on other sides of the display region 100. The display region 100 may include a plurality of sub-pixels configured to display a dynamic picture or a static image. The bonding region 200 may include connecting lines and circuits connecting a plurality of data lines to an integrated circuit. The bezel region 300 may include a power supply line for transmitting a voltage signal. The bonding region 200 and the bezel region 300 may include an isolating dam with a circular structure. At least one side of the bezel region 300 may be a crimping region formed by bending, or both the display region 100 and the border region 300 are bending or crimping regions. No limits are made here in the present disclosure.

Figure 3:
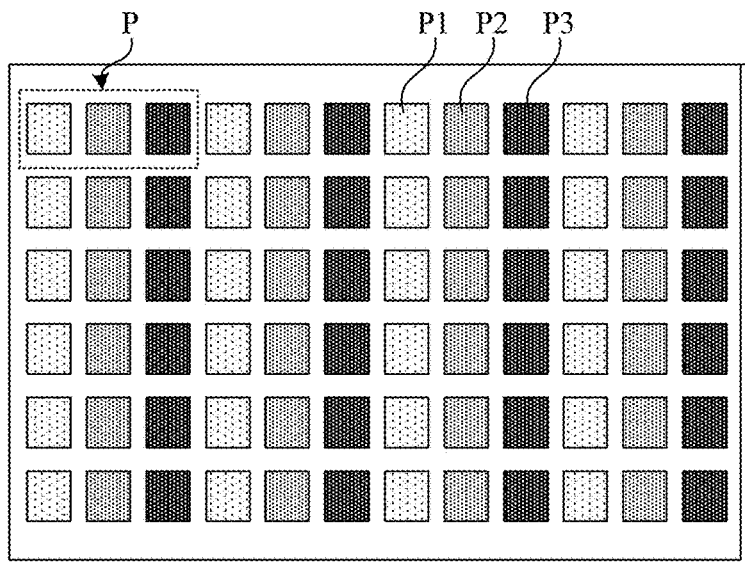
FIG. 3 is a schematic diagram of a planar structure of a display region in a display substrate.

In an exemplary implementation, the display region may include a plurality of pixel units arranged in array. FIG. 3 is a schematic diagram of a planar structure of a display region in a display substrate. As shown in FIG. 3, the display substrate may include a plurality of pixel units P arranged in a matrix, at least one of the plurality of pixel units P includes a first sub-pixel P1 emitting light of a first color, a second sub-pixel P2 emitting light of a second color, and a third sub-pixel P3 emitting light of a third color, and the first sub-pixel P1, the second sub-pixel P2, and the third sub-pixel P3 each includes a pixel drive circuit and an emitting element. The pixel drive circuit in each of the first sub-pixel P1, the second sub-pixel P2, and the third sub-pixel P3 is connected to a scanning signal line, a data line, and an light emitting signal line. The pixel drive circuit is arranged to, under the control of the scanning signal line and the light emitting signal line; receive a data voltage transmitted by the data line and output a corresponding current to the emitting element. The emitting elements in the first sub-pixel P1, the second sub-pixel P2, and the third sub-pixel P3 are connected with the pixel drive circuits of the corresponding sub-pixels respectively. The emitting element is arranged to emit light of corresponding luminance responsive to the current output by the pixel drive circuit of the corresponding sub-pixel.

In an exemplary implementation, a pixel unit P may include a Red (R) sub-pixel, a Green (G) sub-pixel, and a Blue (B) sub-pixel, or may include a red sub-pixel, a green sub-pixel, a blue sub-pixel and a white sub-pixel, which is not limited in the present disclosure. In an exemplary implementation, a shape of the sub-pixel in the pixel unit may be a rectangle, a rhombus, a pentagon, or a hexagon. When the pixel unit includes three sub-pixels, the three sub-pixels may be disposed in a manner to stand side by side horizontally, in a manner to stand side by side vertically, or in a pyramid manner with two units sitting at the bottom and one unit placed on top. When the pixel unit includes four sub-pixels, the four sub-pixels may be disposed in a manner to stand side by side horizontally, in a manner to stand side by side vertically, or in a manner to form a square, which is not specifically limited in the present disclosure.

Figure 4:
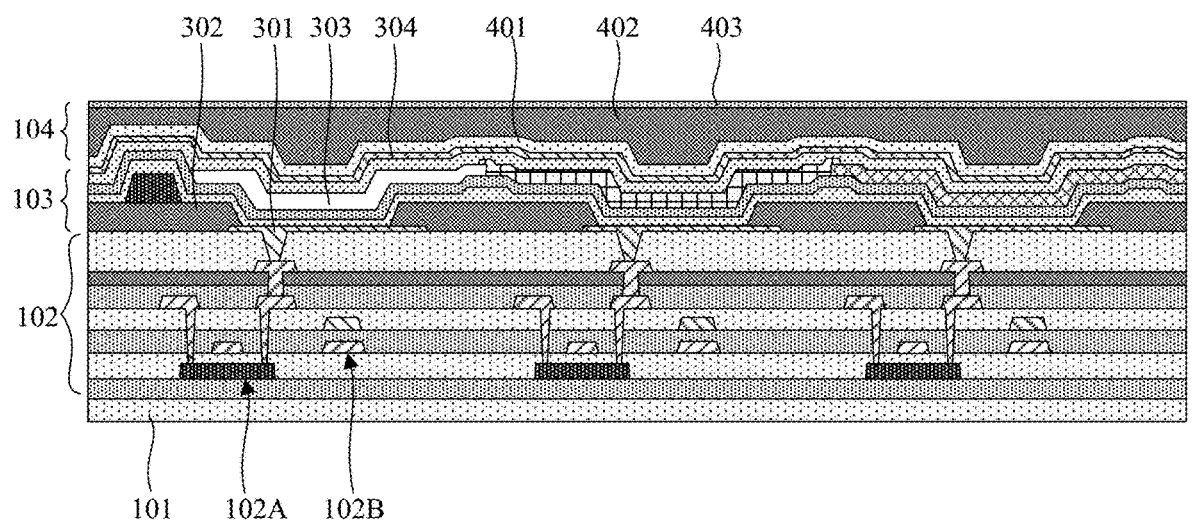
FIG. 4 is a schematic diagram of a sectional structure of a display region in a display substrate.

FIG. 4 is a schematic diagram of a sectional structure of a display region in a display substrate, illustrating structures of three sub-pixels of an OLED display substrate. Referring to FIG. 4, on a plane perpendicular to the display substrate, the display substrate may include a drive circuit layer 102 disposed on a substrate 101, an light emitting structure layer 103 disposed on a side of the drive circuit layer 102 away from the substrate 101, and an encapsulation layer 104 disposed on a side of the emitting structure layer 103 away from the substrate 101. In some possible embodiments, the display substrate may include other thin film layers, such as post spacers, which is not limited in the present disclosure.

In an exemplary embodiment, the substrate 101 may be a flexible substrate or may be a rigid substrate. The drive circuit layer 102 of each sub-pixel may include a plurality of transistors and storage capacitors that form a pixel drive circuit. In FIG. 4, only one transistor 102A and one storage capacitor 102B are taken as an example. The emitting structure layer 103 may include an anode 301, a pixel define layer 302, an organic emitting layer 303 and a cathode 304. The anode 301 is connected to a drain electrode of the drive transistor 210 through a via, the organic emitting layer 303 is connected to the anode 301, and the cathode 304 is connected to the organic emitting layer 303. The organic emitting layer 303 emits light of a corresponding color under the drive of the anode 301 and the cathode 304. The encapsulation layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, thus ensuring that external water vapor cannot enter the light emitting structure layer 103.

In an exemplary implementation mode, the organic emitting layer 303 may include a Hole Injection Layer (HIL for short), a Hole Transport Layer (HTL for short), an Electron Block Layer (EBL for short), an Emitting Layer (EML for short), a Hole Block Layer (HBL for short), an Electron Transport Layer (ETL for short), and an Electron Injection Layer (EIL for short) that are stacked. In an exemplary implementation, the hole injection layers of all the sub-pixels may be connected together to form a through layer; the electron injection layers of all the sub-pixels may be a connected together to form a through layer; the hole transport layers of all the sub-pixels may be connected together to form a through layer; the electron transport layers of all the sub-pixels may be connected together to form a through layer; the hole block layers of all the sub-pixels may be connected together to form a through layer; the light emitting layers of adjacent sub-pixels may be overlapped slightly, or may be isolated from each other; the electron block layers of the adjacent sub-pixels may be overlapped slightly, or may be isolated from each other.

Figure 5:
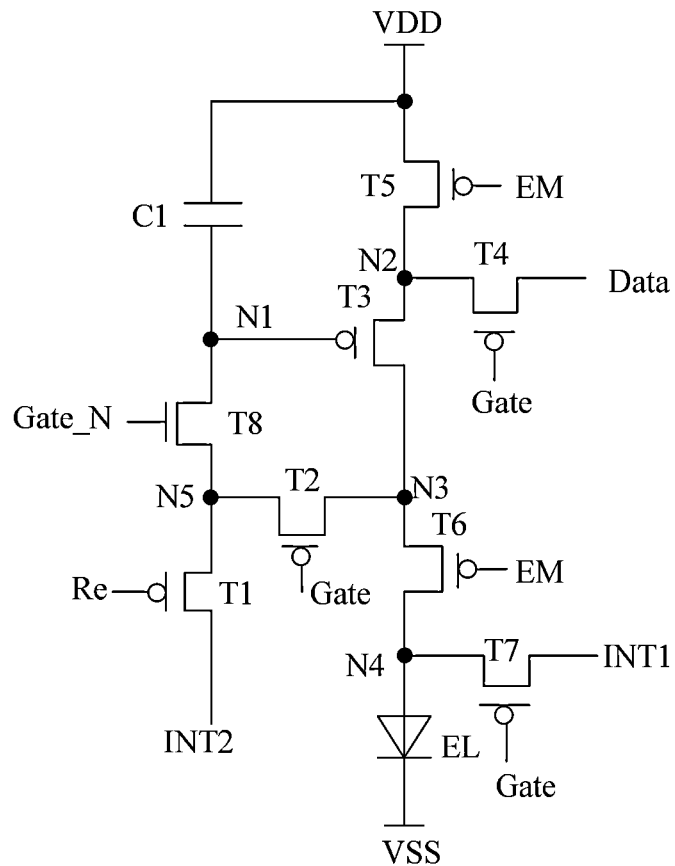
FIG. 5 is a schematic equivalent circuit diagram of a pixel circuit according to an embodiment of the present disclosure.

In an exemplary implementation, the pixel drive circuit may have a structure of 3T1C, 4T1C, 5T1C, 5T2C, 6T1C or 7T1C. FIG. 5 is a schematic diagram of an equivalent circuit of a pixel drive circuit according to an embodiment of the present disclosure. As shown in FIG. 5, a pixel drive circuit may include 8 transistors (a first transistor T1 to an eighth transistor T8), 1 storage capacitor C1 and 9 signal lines (a data signal line Data, a first scanning signal line Gate, a second scanning signal line Re, a third scanning signal line Gate_N, a first initial signal line INT1, a second initial signal line INT2, a first power supply line VDD, a second power supply line VSS and an light emitting control signal line EM).

In an exemplary embodiment, a gate electrode of the first transistor T1 is connected to a second scanning signal line Re, a first electrode of the first transistor T1 is connected to a second initial signal line INI2, and a second electrode of the first transistor T1 is connected to a fifth node N5. A gate electrode of the second transistor T2 is connected to the first scanning signal line Gate, a first electrode of the second transistor T2 is connected to a third node N3, and a second electrode of the second transistor T2 is connected to the fifth node N5. An end of the storage capacitor C1 is connected to a first node N1, and another end of the storage capacitor C1 is connected to the first power supply line VDD. A gate electrode of the third transistor T3 is connected with the first node N1, a first electrode of the third transistor T3 is connected with the second node N2, and a second electrode of the third transistor T3 is connected with the third node N3. A gate electrode of the fourth transistor T4 is connected with the first scanning signal line Gate, a first electrode of the fourth transistor T4 is connected with the data signal line Data, and a second electrode of the fourth transistor T4 is connected with the second node N2. A gate electrode of the fifth transistor T5 is connected to the emitting control signal line EM, a first electrode of the fifth transistor T5 is connected to the first power supply line VDD, and a second electrode of the fifth transistor T5 is connected to the second node N2. A gate electrode of the sixth transistor T6 is connected with the emitting control signal line EM, a first electrode of the sixth transistor T6 is connected with the third node N3, and a second electrode of the sixth transistor T6 is connected with the fourth node N4. A gate electrode of the seventh transistor T7 is connected with the first scanning signal line Gate, a first electrode of the seventh transistor T7 is connected with the first initial signal line INT1, and a second electrode of the seventh transistor T7 is connected with the fourth node N4. A gate electrode of the eighth transistor T8 is connected to the third scanning signal line Gate_N, a first electrode of the eighth transistor T8 is connected to a fifth node N5, and a second electrode of the eighth transistor T8 is connected to the first node N1.

In an exemplary embodiment, all of the first transistor T1 to the seventh transistor T7 may Low Temperature Poly Silicon (LTPS) thin film Transistors (TFTs), and the second transistor T8 may be an Indium Gallium Zinc Oxide (IGZO) thin film transistor.

In the present embodiment, the indium gallium zinc oxide thin film transistor generates a lower leakage current than the low temperature polysilicon thin film transistor, so that arranging the eighth transistor T8 to be the indium gallium zinc oxide thin film transistor may significantly reduce the generated leakage current. There is no need of arranging the first transistor T1 and the second transistor T2 to be the indium gallium zinc oxide thin film transistor because the size of the low temperature polysilicon thin film transistor is usually smaller than that of the indium gallium zinc oxide thin film transistor. Therefore, the pixel circuit of the embodiment of the present disclosure may usually occupy a relatively small space, which helps to improve the resolution of the display panel.

In this embodiment, by initializing the fifth node N5 to the signal of the first initial signal line INT1 and initializing the fourth node N4 to the signal of the second initial signal line INT2, the reset voltage of the emitting element EL and the reset voltage of the first node N1 can be adjusted respectively, thereby achieving better display effect and alleviating problems such as low frequency flicker.

In an exemplary embodiment, a second electrode of the emitting element is connected to the second power supply line VSS, a signal of the second power supply line VSS is a low level signal and a signal of the first power supply line VDD continuously provides a high-level signal. The first scanning signal line Gate is a scanning signal line in a pixel drive circuit in the present display row, and the second scanning signal line Re is a scanning signal line in a pixel drive circuit in a previous display row, that is, for an nth display row, the first scanning signal line Gate is Gate(n), the second scanning signal line Re is Gate(n−1), the second scanning signal line Re in the present display row and the first scanning signal line Gate in the pixel drive circuit in the previous display row may be a same signal line, so as to reduce signal lines of the display panel and implement a narrow bezel of the display panel.

In an exemplary implementation, the first scanning signal line Gate, the second scanning signal line Re, the third scanning signal Gate_N, the light emitting control signal line EM, the first initial signal line INT1 and the second initial signal line INT2 extend in a horizontal direction. The second power supply line VSS, the first power supply line VDD and the data signal line Data extend in a vertical direction.

In an exemplary embodiment, the light emitting element may be an Organic Light Emitting Diode (OLED), including a first electrode (anode), an organic emitting layer, and a second electrode (cathode) which are stacked.

Figure 6:
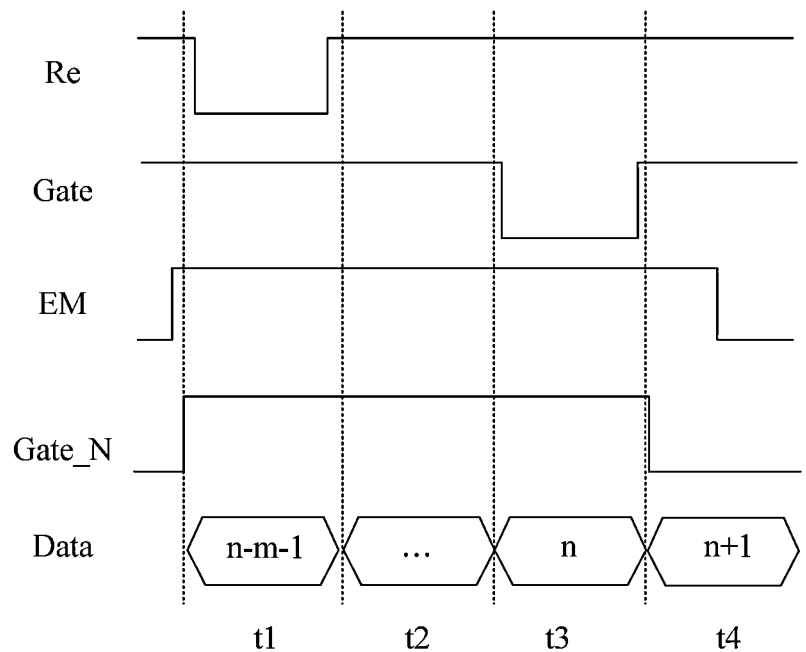
FIG. 6 is a working timing diagram of the pixel circuit shown in FIG. 5.

FIG. 6 illustrates a working timing sequence diagram of a pixel drive circuit. The exemplary embodiment of the present disclosure will be described below through a working process of the pixel drive circuit shown in FIG. 6. In FIG. 5, the pixel drive circuit includes eight transistors (a first transistor T1 to an eighth transistor T8), one storage capacitor C1, and 9 signal lines (a data signal line Data, a first scanning signal line Gate, a second scanning signal line Re, a third scanning signal line Gate_N, a first initial signal line INT1, a second initial signal line INT2, a first power supply line VDD, a second power supply line VSS, and an light emitting control signal line EM). All the first transistor T1 to the seven transistor T7 are P-type transistors, and the eighth transistor T8 is an N-type transistor.

In an exemplary embodiment, the working process of the pixel drive circuit may include the following stages.

In a first stage t1, which referred to a reset stage, the signals of the first scanning signal line Gate, the third scanning signal line Gate_N and the emitting control signal line EM are all high-level signals, and the signal of the second scanning signal line Re is a low-level signal. The high-level signal of the light emitting control signal line EM makes the fifth transistor T5 and the sixth transistor T6 off, the high-level signal of the third scanning signal line Gate_N makes the eighth transistor T8 on, and the low-level signal of the second scanning signal line Re makes the first transistor T1 on. Therefore, the voltage of the first node N1 is reset to the second initial voltage provided by the second initial voltage line INT2, then the potential of the second scanning signal line Re is set to be high and the first transistor T1 is off. Because the fifth transistor T5 and the sixth transistor T6 are off, the emitting element EL does not emit light at this stage.

In a second stage t2, also known as the adjustment stage, the timing sequence of each input signal terminal remains unchanged. This stage may be the scanning period of m rows of gate lines, where m is an integer greater than or equal to 0, and the value of m depends on the specific situation. By adjusting the duration of the second stage t2, the reset and holding time of the first node N1 can be increased, and the bias of the data voltage to the third transistor T3 can be alleviated.

In a third stage t3, which is referred to as the data writing stage, the signal of the first scanning signal line Gate is a low-level signal, the fourth transistor T4, the second transistor T2 and the seventh transistor T7 are switched on, the data signal line Data outputs the data voltage, and the voltage of the fourth node N4 is reset to a first initial voltage provided by the first initial voltage line INTL thus completing the initialization. In this stage, because the first node N1 is at a low level, the third transistor T3 is switched on. The fourth transistor T4 and the second transistor T2 are switched on, so that the data voltage output by the data signal line Data is provided for the first node N1 through the turned-on fourth transistor T4, the second node N2, the turned-on third transistor T3, the third node N3, the turned-on second transistor T2 and the eighth transistor T8, and the storage capacitor C1 is charged with a difference between the data voltage output by the data signal line Data and a threshold voltage of the third transistor T3. A voltage of the second terminal (the first node N1) of the storage capacitor C1 is Vata–Vth, where Vdata is the data voltage output by the data signal line Data, and Vth is the threshold voltage of the third transistor T3. The signal of the light emitting control signal line EM is a high level signal, and the fifth transistor T5 and the sixth transistor T6 are switched off to ensure that the emitting element EL does not emit light.

In the fourth stage t4, which is referred to as the light emitting stage, the signal of the first scanning signal line Gate is a high level signal, and the signals of the light emitting control signal line EM and the third scanning signal line Gate_N are all low level signals. The low-level signal of the light emitting control signal line EM switches the seventh transistor T7 off, and the fifth transistor T5 and the sixth transistor T6 are switched on. A power supply voltage output by the first power supply line VDD provides a driving voltage to the first electrode (i.e., the fourth node N4) of the emitting element EL through the fifth transistor T5, third transistor T3, and sixth transistor T6 which are all switched on to drive the emitting element to emit light.

In a driving process of the pixel circuit, a driving current flowing through the third transistor T3 (i.e., the drive transistor) is determined by a voltage difference between a gate electrode and first electrode of the third transistor T3. Because the voltage of the first node N1 is Vdata-Vth, the driving current of the third transistor T3 is:

$$I=K*(Vgs-Vth)2=K*[(Vdd-Vdata+|Vth|)-Vth]2=K*[(Vdd-Vdata]2.$$

Herein, I is the driving current flowing through the third transistor T3, i.e., the driving current for driving the light emitting element EL, K is a constant, Vgs is the voltage difference between the gate electrode and first electrode of the third transistor T3, Vth is the threshold voltage of the third transistor T3, Vdata is the data voltage output by the data signal line Data, and Vdd is the power voltage output by the first power terminal VDD.

It can be seen from the abovementioned formula that the current I flowing through the emitting element EL is unrelated to the threshold voltage Vth of the third transistor T3, so that the influence of the threshold voltage Vth of the third transistor T3 on the current I is eliminated, and the uniformity of the luminance is ensured.

Based on the abovementioned working timing, the pixel circuit eliminates remaining positive charges of the emitting element EL after the emitting element EL emitted light last time, implements the compensation for the gate voltage of the drive transistor, avoids the influence of a threshold voltage drift of the drive transistor on the driving current of the emitting element EL, and improves the uniformity of a display image and the display quality of the display panel.

For some display substrates, because the inorganic layer is thick, the inorganic film will bear highly concentrated stress when being bent or curled, which will easily cause the film layer to crack, which further triggers wire breakage and poor display. By filling and replacing part of inorganic film with flexible organic layer, metal breakage caused by inorganic film crack may be avoided and the bending performance of products may be improved. However, in some display substrates, if only a small part of inorganic film layers are removed while there is still a large part of inorganic film layers above and around the transistor, there is still a great risk of metal breakage when being bent or curled. At the same time, if the flexible organic layer is directly used to replace the inorganic thin film layer, the performance of transistor devices will be degraded due to the high content of hydrogen (H) and fluorine (F) in organic materials, especially the oxide transistor devices, which will easily fail thereby.

Figure 7A:
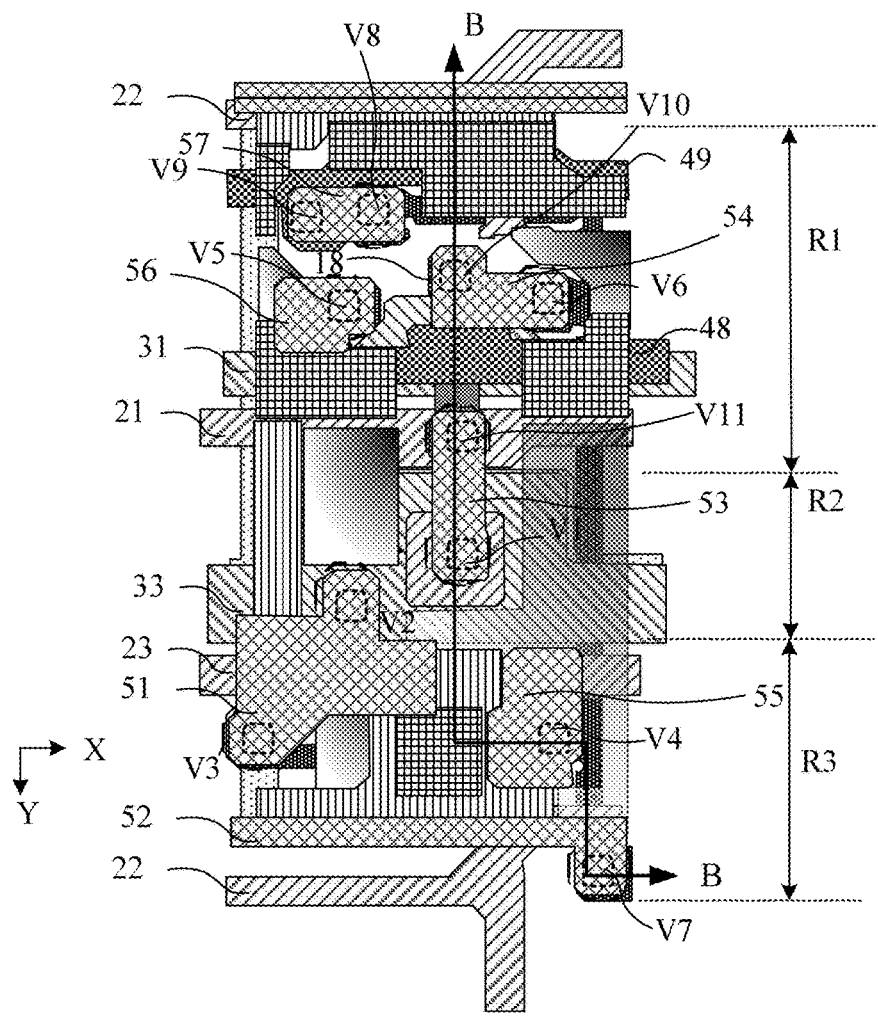
FIG. 7A is a schematic diagram of a planar structure of a display substrate according to an embodiment of the present disclosure.
Figure 7B:
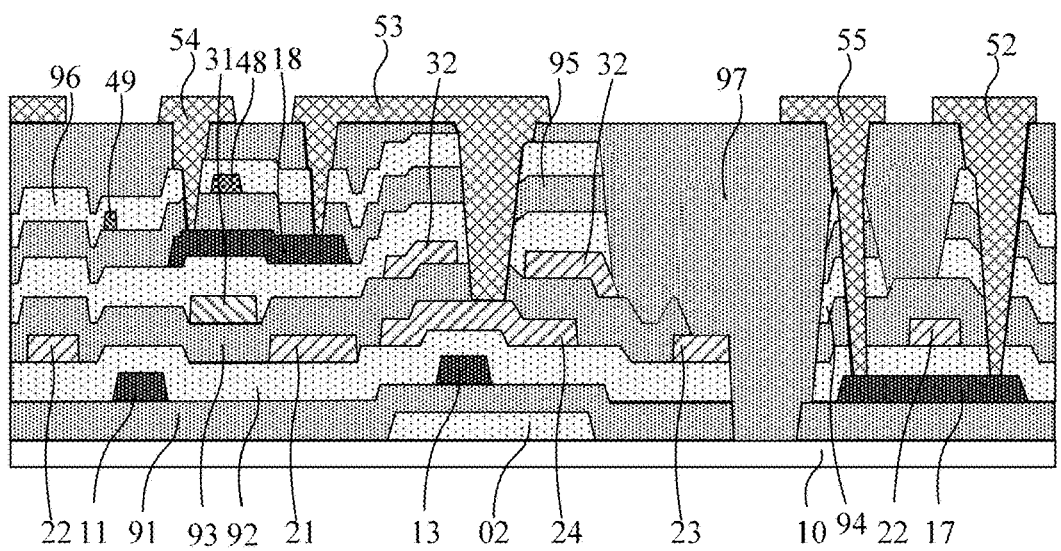
FIG. 7B is a sectional view taken along a B-B direction in FIG. 7A.

FIG. 7A is a schematic diagram of a planar structure of a display substrate according to an embodiment of the present disclosure, and FIG. 7B is a schematic sectional structure diagram of an area BB in FIG. 7A. As shown in FIG. 7A and FIG. 7B, an exemplary embodiment of the present disclosure provides a display substrate. In a plane perpendicular to the display substrate, the display substrate includes a substrate 10, and a light shielding layer, a first insulating layer 91, a first semi-conductive layer, a second insulating layer 92, a first conductive layer, a third insulating layer 93, a second conductive layer, a fourth insulating layer 94, a second semi-conductive layer, a fifth insulating layer 95, a third conductive layer, a sixth insulating layer 96 and an organic layer 97 which are sequentially stacked on the substrate 10;
  the first semi-conductive layer includes an active layer of at least one polysilicon transistor, the first conductive layer includes a gate electrode of at least one polysilicon transistor and a first plate of a storage capacitor, the second conductive layer includes a second plate of a storage capacitor, the second semi-conductive layer includes an active layer of at least one oxide transistor, and the third conductive layer includes a gate electrode of at least one oxide transistor; and
  the sixth insulating layer 96 is provided with a plurality of vias and a plurality of grooves. The plurality of vias expose the active layers of polysilicon transistors and oxide transistors respectively, and there is at least an overlapping region between the orthographic projection of the plurality of vias on the substrate and the orthographic projection of at least one of the first semi-conductive layer, the first conductive layer, the second conductive layer, the second semi-conductive layer and the third conductive layer on the substrate, and the organic layer fills the plurality of grooves.

According to the display substrate of the embodiment of the present disclosure, the inorganic layer is etched to a large extent and is filled with organic layers, so that the fracture caused by stress concentration of the inorganic film during folding or curling is reduced, and the bending performance is improved. While ensuring the characteristics of transistors, the embodiment of the present disclosure only adds an inorganic layer etching process, and other inorganic layer etching processes are synchronously completed by the existing process, which has high compatibility with the existing scheme.

In an exemplary embodiment, an organic layer 97 is a flexible organic layer.

In an exemplary embodiment, the orthographic projection of the plurality of grooves on the substrate 10 is not overlapped with the orthographic projection of the gate electrode of the oxide transistor on the substrate 10.

In an exemplary embodiment, a plurality of vias include a first via group and a second via group, and a plurality of grooves include a first groove group, a second groove group and a third groove group, wherein the vias in the first via group expose both ends of an active layer of a polysilicon transistor, and the vias in the second via group expose both ends of an active layer of an oxide transistor;
  the orthographic projection of the grooves in the first groove group on a substrate 10 is overlapped with the orthographic projection of the gate electrode of at least one polysilicon transistor on the substrate 10, and the grooves in the first groove group expose a third insulating layer 93 on the gate electrode of at least one polysilicon transistor; and
  the orthographic projection of the grooves in the second groove group and the third groove group on the substrate 10 is not overlapped with the orthographic projection of the gate electrode of the polysilicon transistor on the substrate 10.

In an exemplary embodiment, a display substrate includes a plurality of sub-pixels, wherein the sub-pixels include a first region R1, a second region R2 and a third region R3, and the second region R2 is disposed between the first region R1 and the third region R3; a polysilicon transistor includes a first transistor T1, a second transistor T2, a third transistor T3, a fourth transistor T4, a fifth transistor T5, a sixth transistor T6 and a seventh transistor T7, and a oxide transistor includes an eighth transistor T8.

In an exemplary embodiment, a first transistor T1, a second transistor T2, and a fourth transistor T4 are disposed in a first region R1;
  a third transistor T3 and a storage capacitor are disposed in a second region R2;
  a fifth transistor T5, a sixth transistor T6 and a seventh transistor T7 are disposed in a third region R3.

In an exemplary embodiment, a first conductive layer includes a first scanning signal line 21, a second scanning signal line 22, an light emitting control line 23 and a first plate 24 of a storage capacitor, and the second conductive layer includes a first shielding layer 31, a second plate 32 of the storage capacitor and a plate connecting line 33; a third conductive layer includes a third scanning signal line 48 and a second initial signal line 49;
  the first scanning signal line 21, the third scanning signal line 48 and the second initial signal line 49 extend along a first direction X and are disposed in a first region R1;
  the first plate 24, the second plate 32 and the plate connecting line of the storage capacitor are all disposed in a second region R2; and
  the second scanning signal line 22, the emitting control line 23 and the first shielding layer 31 all extend along the first direction X and are disposed in a third region R3.

In an exemplary embodiment, the display substrate further includes a fourth conductive layer disposed on the organic layer 97, wherein the fourth conductive layer includes a power connecting line 51, a first initial signal line 52, a fifth connection electrode 53, a sixth connection electrode 54, a seventh connection electrode 55, an eighth connection electrode 56 and a ninth connection electrode 57;
  a gate electrode of a first transistor T1 is connected with a second scanning signal line 22, a first electrode of the first transistor T1 is connected with a second initial signal line 49 through the ninth connection electrode 57 and a via, and a second electrode of the first transistor T1 and a first electrode of a second transistor T2 are connected with a first electrode of an eighth transistor T8 through the sixth connection electrode 54 and a via; a gate electrode of the second transistor T2 is connected with a first scanning signal line 21; a first plate 24 of a storage capacitor and a gate electrode of a third transistor T3 are connected with a second electrode of the eighth transistor T8 through the fifth connection electrode 53 and a via, and a second plate 32 of the storage capacitor is connected with a first power supply line through the power connecting line 51; a first electrode of the third transistor T3, a second electrode of a fourth transistor and a second electrode of a fifth transistor are mutually connected into an integrated structure, and a second electrode of the third transistor T3, a second electrode of the second transistor and a first electrode of a sixth transistor are mutually connected into an integrated structure; a gate electrode of the fourth transistor T4 is connected with a first scanning signal line, and a first electrode of the fourth transistor T4 is connected with a data signal line through the eighth connection electrode 56 and a via; a gate electrode of the fifth transistor T5 is connected with an light emitting control signal line, and a first electrode of the fifth transistor T5 is connected with the first power supply line; a gate electrode of the sixth transistor T6 is connected with the emitting control signal line, and a second electrode of the sixth transistor T6 and a second electrode of a seventh transistor T7 are mutually connected through a seventh connection electrode 55 and a via; a gate electrode of the seventh transistor T7 is connected with the first scanning signal line 21, and a first electrode of the seventh transistor T7 is connected with the first initial signal line 52; and a gate electrode of the eighth transistor T8 is connected with a third scanning signal line 48.

In an exemplary embodiment, a plurality of grooves include a first groove;
the first groove is disposed in a first region R1, and the orthographic projection of the first groove on a substrate 10 is overlapped with the orthographic projection of an active layer of a first transistor T1 and an active layer of a second transistor T2 on the substrate 10; and there is at least an overlapping region between the orthographic projection of the first groove on the substrate 10 and the orthographic projection of the second scanning signal line 22 on the substrate 10.

In an exemplary embodiment, a plurality of grooves include a second groove, which is disposed in a first region R1, there is at least a non-overlapping region between the orthographic projection of the second groove on the substrate 10 and the orthographic projection of a first semi-conductive layer on the substrate 10; there is at least a non-overlapping region between the orthographic projection of the second groove on the substrate 10 and the orthographic projection of a second semi-conductive layer on the substrate 10; and there is at least an overlapping region between the orthographic projection of the second groove on the substrate 10 and the orthographic projection of a light shielding layer on the substrate 10.

In an exemplary embodiment, a plurality of grooves include a third groove;
the third groove is disposed in a second region R2 and a third region R3, there is at least an overlapping region between the orthographic projection of the third groove on the substrate 10 and the orthographic projection of an active layer of a third transistor T3 on the substrate; and there is at least an overlapping region between the orthographic projection of the third groove on the substrate 10 and the orthographic projections of a second plate and a plate connecting line on the substrate 10.

In an exemplary embodiment, the third groove is also disposed in the third region R3, there is at least an overlapping region between the orthographic projection of the third groove on the substrate 10 and the orthographic projection of the active layer of the sixth transistor T6 on the substrate; and there is at least an overlapping region between the orthographic projection of the third groove on the substrate 10 and the orthographic projection of the light emitting control line on the substrate 10.

In an exemplary embodiment, there is at least an overlapping region between the orthographic projection of the third groove on the substrate 10 and the orthographic projection of the active layer of the seventh transistor T7 on the substrate; and there is at least an overlapping region between the orthographic projection of the third groove on the substrate 10 and the orthographic projection of the second scanning signal line on the substrate 10.

In an exemplary embodiment, a plurality of grooves include a fourth groove disposed in the second region R2, there is at least an overlapping region between the orthographic projection of the fourth groove on the substrate 10 and the orthographic projection of an active layer of a fourth transistor T4 on the substrate 10; and there is at least an overlapping region between the orthographic projection of the fourth groove on the substrate 10 and the orthographic projection of a second plate on the substrate 10.

In an exemplary embodiment, a plurality of grooves include a fifth groove disposed in the third region R3, there is at least an overlapping region between the orthographic projection of the fifth groove on the substrate 10 and the orthographic projection of an active layer of a fifth transistor T5 on the substrate 10; and there is at least an overlapping region between the orthographic projection of the fifth groove on the substrate 10 and the orthographic projection of an light emitting control line on the substrate 10.

In an exemplary embodiment, a second groove group includes a sixth groove, and there is at least an overlapping region between the orthographic projection of the sixth groove on the substrate 10 and the orthographic projection of a second scanning signal line 22 on the substrate 10.

In an exemplary embodiment, the second groove group includes a seventh groove, there is at least an overlapping region between the orthographic projection of the seventh groove on the substrate 10 and the orthographic projection of a first scanning signal line 21 and an light emitting control line 23 on the substrate 10.

In an exemplary embodiment, the second groove group includes an eighth groove, which is disposed in a third region R3, and there is at least a non-overlapping region between the orthographic projection of the eighth groove on the substrate 10 and the orthographic projection of a first semi-conductive layer on the substrate 10; there is at least an overlapping region between the orthographic projection of the eighth groove on the substrate 10 and the orthographic projection of an light emitting control line on the substrate; and there is at least an overlapping region between the orthographic projection of the eighth groove on the substrate 10 and the orthographic projection of a second scanning signal line 22 on the substrate 10.

In an exemplary embodiment, a third groove group includes a ninth groove and a tenth groove.

The ninth groove and the tenth groove are both disposed in a first region R1, which are located on both sides of a ninth connection electrode 57 along a first direction X, and there is at least an overlapping region between the orthographic projection of the ninth and tenth groove on the substrate 10 and the orthographic projection of a second initial signal line 49 on the substrate 10.

In an exemplary embodiment, a third groove group includes an eleventh groove and a twelfth groove.

The eleventh groove and the twelfth groove are both disposed in a first region R1, and are respectively located at two sides of the eighth transistor T8 along a first direction X, and there is at least an overlapping region between the orthographic projection of the eleventh groove and the twelfth groove on the substrate and the orthographic projection of a third scanning signal line 48 on the substrate.

In an exemplary embodiment, a third groove group includes a thirteenth groove disposed in a third region R3, and there is at least an overlapping region between the orthographic projection of the thirteenth groove on the substrate 10 and the orthographic projection of an eighth groove on the substrate 10.

The process of preparing the display substrate will be exemplarily described below. "Patterning process" mentioned in the present disclosure includes photoresist coating, mask exposure, development, etching, photoresist stripping and so on for metal materials, inorganic materials or transparent conducting materials, and includes organic material coating, mask exposure, development and so on for organic materials. Deposition may be implemented by adopting any one or more of sputtering, evaporation and chemical vapor deposition. Coating may be implemented by adopting any one or more of spray coating, spin coating and inkjet printing, and etching may be implemented by adopting any one or more of dry etching and wet etching, which are not limited in the present disclosure. "Thin film" refers to a layer of thin film formed by a certain material on a substrate through deposition, coating or other processes. If a "thin film" does not need a patterning process in the whole preparing process, the "thin film" may also be called a "layer". If a "thin film" needs a patterning process in the whole preparing process, it is referred to as "thin film" before the patterning process and "layer" after the patterning process. A "layer" obtained after a patterning process includes at least one "pattern". "A and B are disposed in the same layer" in the present disclosure means that A and B are formed at the same time through the same patterning process, and the "thickness" of the film layer is the size of the film layer in a direction perpendicular to the display substrate. In an exemplary embodiment of the present disclosure, "an orthographic projection of B is within the range of an orthographic projection of A" refers to the boundary of the orthographic projection of B falling within the boundary range of the orthographic projection of A, or the boundary of the orthographic projection of A is overlapped with the boundary of the orthographic projection of B. "An orthographic projection of A including an orthographic projection of B" means that a boundary of the orthographic projection of B falls within a range of boundary of the orthographic projection of A, or the boundary of the orthographic projection of A is overlapped with the boundary of the orthographic projection of B.

Figure 8A:
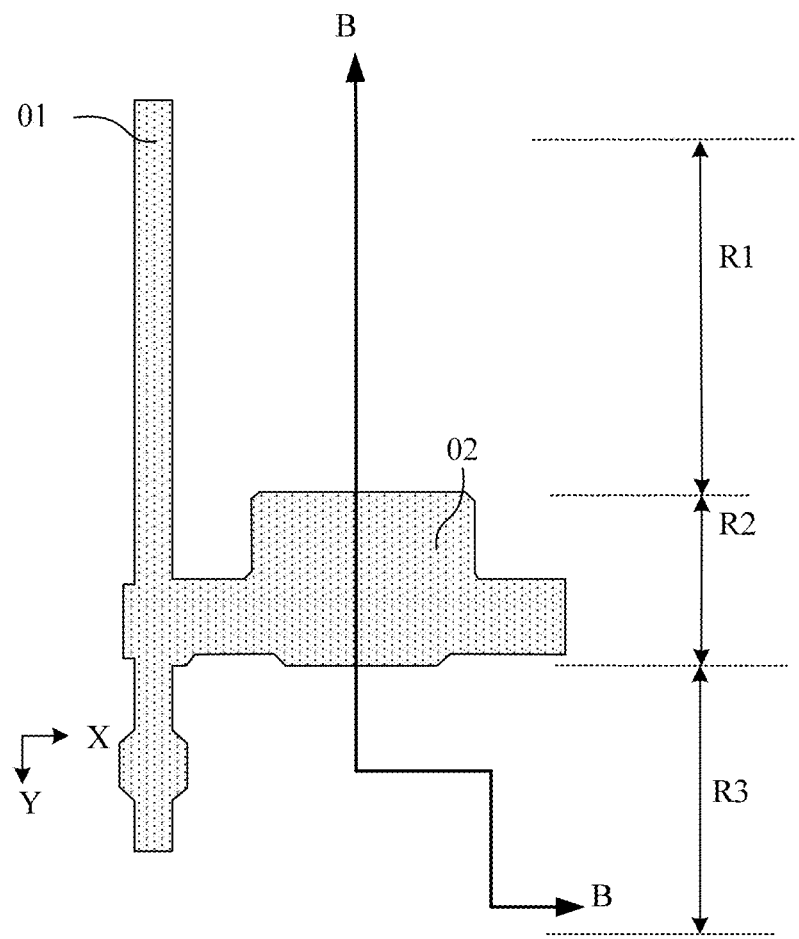
FIG. 8A is a schematic diagram of a display substrate after a pattern of a light shield layer is formed according to the present disclosure.
Figure 8B:
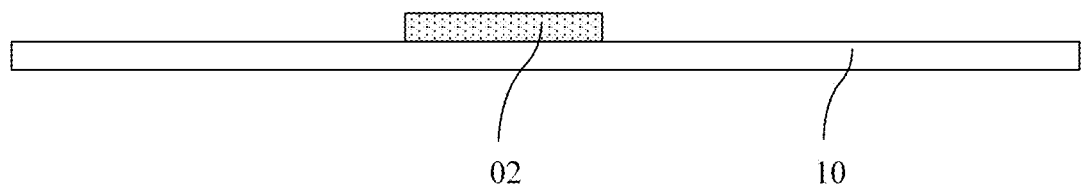
FIG. 8B is a sectional view taken along a B-B direction in FIG. 8A.

In an exemplary embodiment, the preparation process of the display substrate may include the following operations:

(11) A pattern of a light shielding layer is formed. In an exemplary embodiment, forming a pattern of a light shielding layer may include depositing a light shielding thin film on the substrate 10; coating a layer of photoresist on the light shielding thin film, exposing and developing the photoresist with a single tone mask, forming a unexposed region with remaining photoresist at the position of the pattern of the light shielding layer and fully exposed regions without photoresist at other positions to expose the light shielding thin film; etching the light shielding thin film in the fully exposed region and stripping the remaining photoresist to form a pattern of the light shielding layer on the substrate 10, as shown in FIG. 8A and FIG. 8B, wherein FIG. 8B is a sectional view taken along a B-B direction in FIG. 8A. Wherein, the light shielding thin film may adopt one of metals such as silver Ag, molybdenum Mo, aluminum Al, copper Cu, etc., or a composite layer structure of a plurality of metals, such as Mo/Cu/Mo.

In an exemplary embodiment, as shown in FIGS. 8A and 8B, the light shielding layer of each sub-pixel may include a first light shielding layer 01 and a second light shielding layer 02, the first light shielding layer 01 is disposed in a first region R1, a second region R2 and a third region R3, and the first light shielding layer 01 extends along a second direction Y; the second light shielding layer 02 is disposed in the second region R2, and the second light shielding layer 02 extends along a first direction X, wherein the first direction X intersects with the second direction Y.

In an exemplary embodiment, the first light shielding layer 01 and the second light shielding layer 02 may be an integrated structure connected with each other.

(12) A pattern of a first semi-conductive layer is formed. In an exemplary embodiment, forming a pattern of a first semi-conductive layer may include sequentially depositing a first insulating thin film and a first active layer thin film on the substrate on which the aforementioned pattern is formed; coating a layer of photoresist on the first active layer thin film, exposing and developing the photoresist with a single tone mask, forming a unexposed region with remaining photoresist at the position of the pattern of the first active layer and forming fully exposed regions without photoresist at other positions; and etching the first active layer thin film in the fully exposed region and stripping the remaining photoresist to form patterns of the first insulating layer 91 and the first semi-conductive layer. Wherein, the first insulating layer 91 is used to block the influence of ions in the substrate on the thin film transistor, the first insulating layer 91 may be a composite thin film of silicon nitride SiNx, silicon oxide SiOx or SiNx/SiOx, and the first active layer thin film may be made of a silicon material, which includes amorphous silicon and polysilicon. The first active layer thin film may alternatively be made of amorphous silicon a-Si, and polysilicon may be formed by crystallization or laser annealing, as shown in FIGS. 9A and 9B, wherein FIG. 9B is a sectional view taken along a B-B direction in FIG. 9A.

Figure 9A:
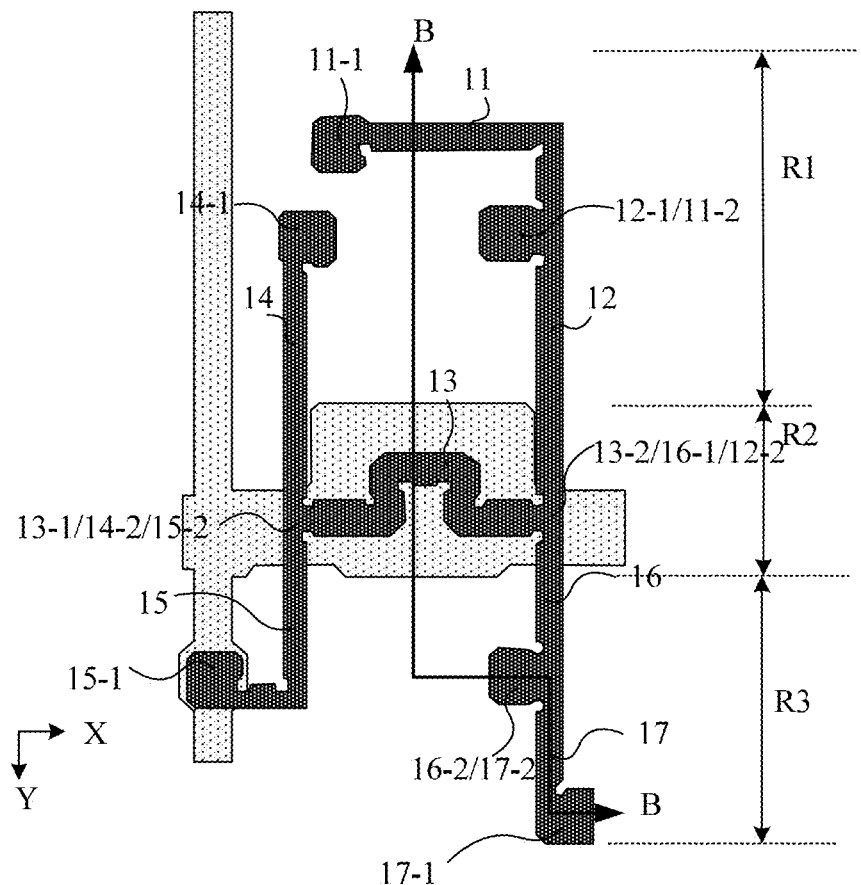
FIG. 9A is a schematic diagram of a display substrate after a pattern of a first semi-conductive layer is formed according to the present disclosure.
Figure 9B:
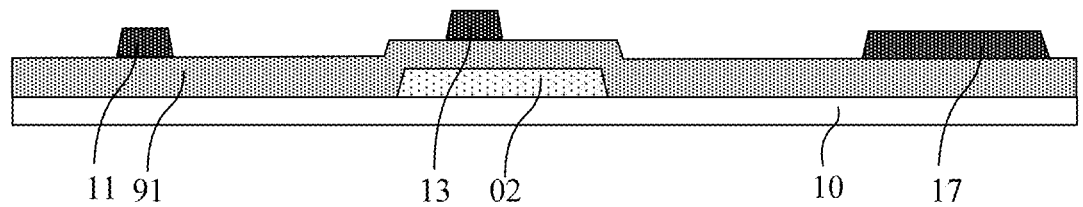
FIG. 9B is a sectional view taken along a B-B direction in FIG. 9A.

As shown in FIG. 9A, a first semi-conductive layer of each sub-pixel may include a first active layer 11 of the first transistor T1 to a seventh active layer 17 of the seventh transistor T7, and the first active layer 11 to the seventh active layer 17 is an integral structure connected to each other.

In an exemplary embodiment, the first active layer 11 of the first transistor T1, the second active layer 12 of the second transistor T2, the fourth active layer 14 of the fourth transistor T4 are disposed in the a first region R1, the third active layer 13 of the third transistor T3 is disposed in a second region R2, and the fifth active layer 15 of the fifth transistor T5, the sixth active layer 16 of the sixth transistor T6 and the seventh active layer 17 of the seventh transistor T7 are disposed in a third region R3. The first active layer 11 is disposed at a side in the first region R1 away from the second region R2, and the second active layer 12 and the fourth active layer 14 are disposed at a side in the first region R1 adjacent to the second region R2. The seventh active layer 17 is disposed at a side in the third region R3 away from the second region R2, and the fifth active layer 15 and the sixth active layer 16 are disposed at a side in the third region R3 adjacent to the second region R2.

In an exemplary embodiment, the third active layer 13 may be n-shaped, the fourth active layer 14 may be 1-shaped, and the first active layer 11, second active layer 12, fifth active layer 15, sixth active layer 16 and seventh active layer 17 may be L-shaped.

In an exemplary embodiment, the active layer of each transistor includes a first region, a second region, and a channel region located between the first region and the second region. In an exemplary embodiment, the second region 11-2 of the first active layer 11 serves as the first region 12-1 of the second active layer 12, i.e., the second region 11-2 of the first active layer 11 is connected to the first region 12-1 of the second active layer 12. The first region 13-1 of the third active layer 13 also serves as the second region 14-2 of the fourth active layer 14 and the second region 15-2 of the fifth active layer 15, that is, the first region 13-1 of the third active layer 13, the second region 14-2 of the fourth active layer 14 and the second region 15-2 of the fifth active layer 15 are connected to each other. The second region 13-2 of the third active layer 13 also serves as the first region 16-1 of the sixth active layer 16 and the second region 12-2 of the second active layer 12, that is, the second region 13-2 of the third active layer 13, the first region 16-1 of the sixth active layer 16 and the second region 12-2 of the second active layer 12 are connected to each other. The second region 16-2 of the sixth active layer 16 serves as the second region 17-2 of the seventh active layer 17, i.e., the second region 16-2 of the sixth active layer 16 is connected to the second region 17-2 of the seventh active layer 17. The first region 11-1 of the first active layer 11, the first region 14-1 of the fourth active layer 14, the first region 15-1 of the fifth active layer 15 and the first region 17-1 of the seventh active layer 17 are disposed separately.

With reference to FIG. 8A and FIG. 9A, in an exemplary embodiment, the first light shielding layer 01 is provided with a first light shielding protrusion protruding in a direction perpendicular to the extension direction of the first light shielding layer 01, and the first light shielding protrusion is disposed in the third region R3, and the orthographic projection of the first light shielding protrusion on the substrate 10 covers the orthographic projection of the first region 15-1 of the fifth active layer 15 on the substrate 10.

In an exemplary embodiment, the first semi-conductive layer may be made of polysilicon (p-Si), that is, the first transistor, the second transistor, the third transistor, the fourth transistor, the fifth transistor, the sixth transistor and the seventh transistor are LTPS thin film transistors.

As shown in FIG. 9B, after this process, the display substrate includes a first insulating layer 91 disposed on the substrate 10 and a first semi-conductive layer disposed on the first insulating layer 91. The first semi-conductive layer may include the first active layer 11 to the seventh active layer 17.

Figure 10A:
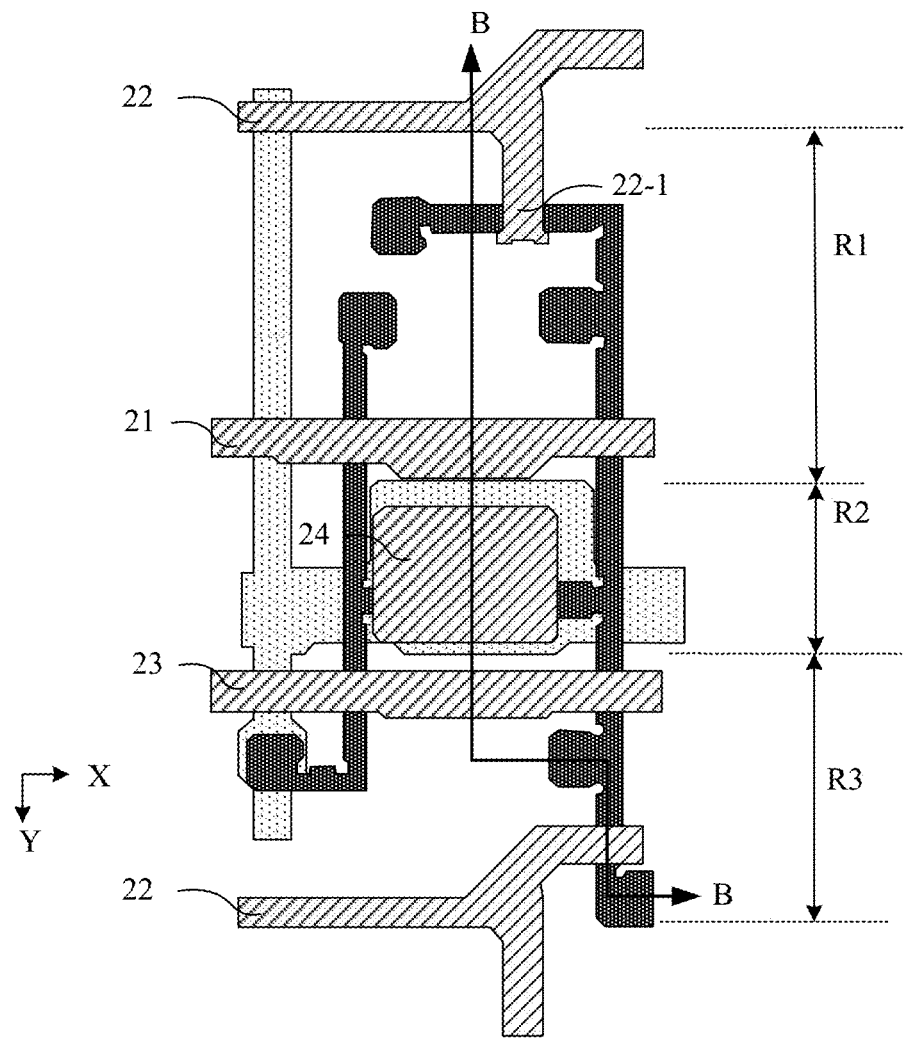
FIG. 10A is a schematic diagram of a display substrate after a pattern of a first conductive layer is formed according to the present disclosure.
Figure 10B:
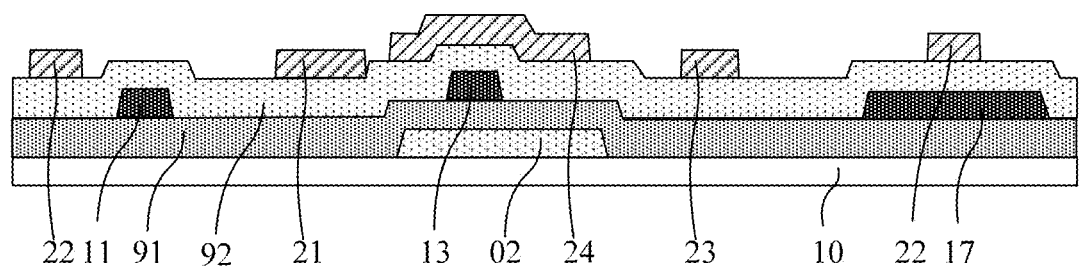
FIG. 10B is a sectional view taken along a B-B direction in FIG. 10A.

(13) A pattern of a first conducting layer is formed. In an exemplary embodiment, forming a pattern of a first conductive layer may include: depositing a second insulating thin film and a first metal thin film in sequence on the substrate on which the aforementioned patterns are formed, and patterning the first metal thin film through the patterning process to form a second insulating layer covering the pattern of the first semi-conductive layer and the pattern of the first conductive layer disposed on the second insulating layer. The pattern of the first conductive layer at least includes the first scanning signal line 21, the second scanning signal 22, the light emitting control line 23 and the first electrode plate 24 of the storage capacitor, as shown in FIGS. 10A and 10B, wherein FIG. 10B is a sectional view taken along a B-B direction in FIG. 10A. In an exemplary embodiment, a first conductive layer may be referred to as a first gate metal (Gate1) layer.

In an exemplary embodiment, a first scanning signal line 21, a second scanning signal line 22, and an light emitting control line 23 extend along a first direction X. The first scanning signal line 21 is disposed in a first region R1, the second scanning signal line 22 and the emitting control line 23 are disposed in a third region R3, the second scanning signal line 22 is located on one side of the emitting control line 23 away from a second region R2, and the first electrode plate 24 of the storage capacitor is disposed in the second region R2 between the first scanning signal line 21 and the light emitting control line 23.

In an exemplary embodiment, a first electrode plate 24 may be rectangular, and rectangle corners may be arranged with chamfer. There is an overlapping region between an orthographic projection of the first electrode plate 24 on the substrate 10 and an orthographic projection of a third active layer of a third transistor T3 on the substrate 10. In an exemplary embodiment, a first electrode plate 24 also serves as a gate electrode of a third transistor T3, and a region of the third active layer of the third transistor T3 being overlapped with a first electrode plate 24 serves as a channel region of the third transistor T3. An end of the channel region is connected to a first region of a third active layer and the other end is connected to a second region of the third active layer. A second scanning signal line 22 is provided with a gate block 22-1 protruding to the side of a first scanning signal line 21. There is an overlapping region between the orthographic projection of the gate block 22-1 on the substrate 10 and the orthographic projection of a first active layer of a first transistor T1 on the substrate 10. The region where the gate block 22-1 is overlapped with the first active layer of the first transistor T1 serves as the gate electrode of the first transistor T1. The region where the first scanning signal line 21 is overlapped with the second active layer of the second transistor T2 serves as the gate electrode of the second transistor T2, the region where the first scanning signal line 21 is overlapped with the fourth active layer of the fourth transistor T4 serves as the gate electrode of the fourth transistor T4, the region where the first plate 24 is overlapped with the third active layer of the third transistor T3 serves as the gate electrode of the third transistor T3, the region where the light emitting control line 23 is overlapped with the fifth active layer of the fifth transistor T5 serves as the gate electrode of the fifth transistor T5, the region where the light emitting control line 23 is overlapped with the sixth active layer of the sixth transistor T6 serves as the gate electrode of the sixth transistor T6, and the region where the second scanning signal line 22 is overlapped with the seventh active layer of the seventh transistor T7 serves as the gate electrode of the seventh transistor T7.

In an exemplary embodiment, after the pattern of the first conductive layer is formed, the semi-conductive layer may be subjected to a conductive treatment by using the first conductive layer as a shield. The semi-conductive layer with a region shielded by the first conductive layer forms channel regions of the first transistor T1 to the seventh transistor T7, and the semi-conductive layer without a region shielded by the first conductive layer is made to be conductive, that is, first regions and second regions of the first active layer to the seventh active layer are made to be conductive.

With reference to FIG. 8A and FIG. 10A, in an exemplary embodiment, a second light shielding layer 02 is provided with a second light shielding protrusion protruding along a direction perpendicular to the extending direction of the second light shielding layer 02, and the second light shielding protrusion is disposed in the second region R2, and the orthographic projection of the second light shielding protrusion on the substrate 10 covers the orthographic projection of the first electrode plate 24 on the substrate 10.

As shown in FIG. 10B, after this process, the display substrate includes a light shielding layer disposed on the substrate 10, a first insulating layer 91 disposed on the light shielding layer, a first semi-conductive layer disposed on the first insulating layer 91, a second insulating layer 92 covering the first semi-conductive layer, and a first conductive layer disposed on the second insulating layer 92. The first conductive layer may include a first scanning signal line 21, a second scanning signal line 22, an light emitting control line 23, and a first plate 24 of a storage capacitor.

Figure 11A:
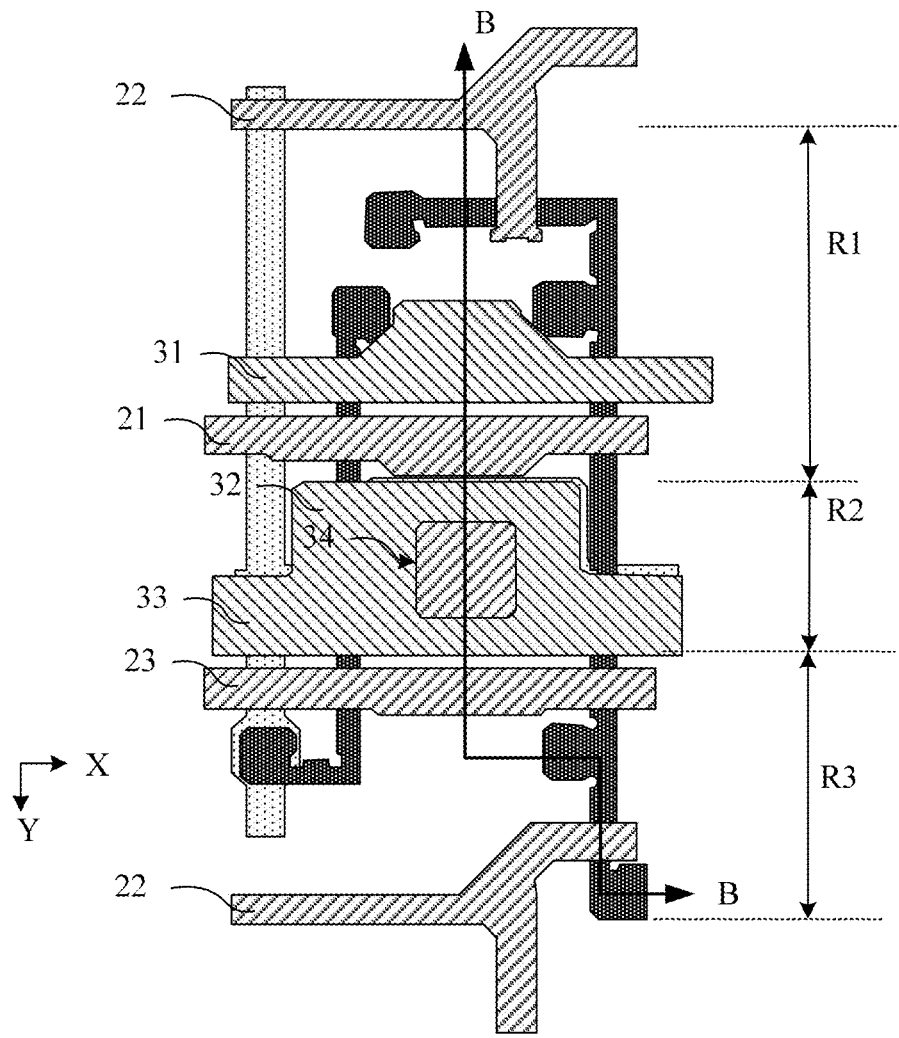
FIG. 11A is a schematic diagram of a display substrate after a pattern of a second conductive layer is formed according to the present disclosure.
Figure 11B:
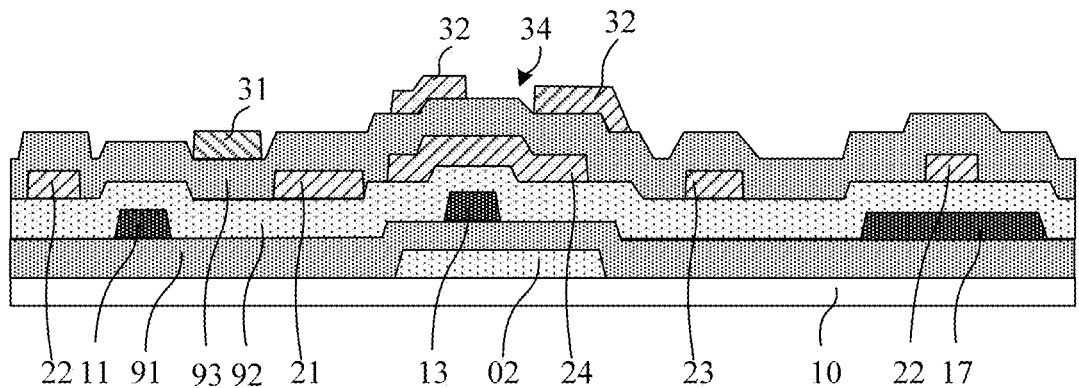
FIG. 11B is a sectional view taken along a B-B direction in FIG. 11A.

(14) A pattern of a second conductive layer is formed. In an exemplary embodiment, forming the pattern of the second conductive layer may include: depositing a third insulating thin film and a second metal thin film in sequence on the substrate on which the aforementioned patterns are formed, and patterning the second metal thin film through the patterning process to form the third insulating layer 93 covering the first conductive layer and the pattern of the second conductive layer disposed on the third insulating layer 93. The pattern of the second conductive layer at least include a first shielding layer 31, a second electrode plate 32 of the storage capacitor, a electrode plate connecting line 33, as shown in FIGS. 11A and 11B, wherein, FIG. 11B is a sectional view taken along a B-B direction in FIG. 11A. In an exemplary embodiment, a second conductive layer may be referred to as a second gate metal (Gate2) layer.

As shown in FIG. 11A, in an exemplary embodiment, a first shielding layer 31 extending along a first direction X is disposed in a first region R1, and is located on a side of the first scanning signal line 21 away from a second region R2. A second electrode plate 32 of the storage capacitor is disposed in the second region R2 between the first scanning signal line 21 and a light emitting control line 23.

In an exemplary embodiment, the first shielding layer 31 may be provided with unequal widths, and a width of the first shielding layer 31 is the dimension of the first shielding layer 31 along a second direction Y. The first shielding layer 31 includes a region overlapping with the semi-conductive layer and a region not overlapping with the semi-conductive layer, and a width of the first shielding layer 31 in the region not overlapping with the semi-conductive layer may be smaller than the width of the first shielding layer 31 in the region overlapping with the semi-conductive layer. In an exemplary embodiment, a first shielding layer 31 is configured as a shielding layer of the eighth transistor, shielding the channel of the eighth transistor and ensuring the electrical performance of the eighth transistor (oxide transistor).

In an exemplary embodiment, a contour of the second electrode plate 32 may be rectangular, and corners of the rectangle may be arranged with chamfer. There is an overlapping region between an orthographic projection of the second electrode plate 32 on the substrate 10 and an orthographic projection of the first electrode plate 24 on the substrate 10. The second plate 32 is provided with an opening 34, which can be located in the middle of the second region R2. The opening 34 may be rectangular, so that the second electrode plate 32 forms an annular structure. The opening 34 exposes the third insulating layer 93 covering the first electrode plate 24, and the orthographic projection of the first electrode plate 24 on the substrate 10 contains an orthographic projection of the opening 34 on the substrate 10. In an exemplary embodiment, an opening 34 is configured to accommodate a first via subsequently formed, which is located in the opening 34 and exposes a first electrode plate 24, so that a second electrode of an eighth transistor T8 subsequently formed is connected to the first electrode plate 24.

In an exemplary embodiment, an electrode plate connecting line 33 is disposed between second electrode plates 32 of adjacent sub-pixels along a first direction X, a first end of the electrode plate connecting line 33 is connected to the second electrode plate 32 of the present sub-pixel, and a second end of the electrode plate connecting line 33 extending along the first direction X or an opposite direction of the first direction X is connected to the second electrode plates 32 of the adjacent sub-pixels, that is, the electrode plate connecting line 33 is configured to allow the second electrode plates of the adjacent sub-pixels in the first direction X to be connected to each other. In an exemplary embodiment, second electrode plates in a sub-pixel row form an integrated structure connected to each other through the electrode plate connecting line 33, and the second electrode plates in the integrated structure may be reused as power supply signal lines, thus ensuring that a plurality of second electrode plates in a sub-pixel row have a same potential, which is beneficial to improving uniformity of the panel, avoiding a poor display of the display substrate and ensuring a display effect of the display substrate.

In an exemplary embodiment, an orthographic projection of an edge of a second electrode plate 32 adjacent to a first region R1 on the substrate 10 is overlapped with an orthographic projection of a boundary line of the first region R1 and a second region R2 on the substrate 10; an orthographic projection of an edge of the second electrode plate 32 adjacent to a third region R3 on the substrate 10 is overlapped with an orthographic projection of a boundary line of the second region R2 and the third region R3 on the substrate 10, that is, a length of the second electrode plate 32 is equal to a length of the second region R2, and the length of the second electrode plate 32 refers to a dimension of the second electrode plate 32 in a second direction Y.

As shown in FIG. 11B, in a direction perpendicular to a substrate 10, a light shielding layer is disposed on the substrate 10, a first insulating layer 91 is disposed on the light shielding layer, a first semi-conductive layer is disposed on the first insulating layer 91, a second insulating layer 92 covers the first semi-conductive layer, a first conductive layer is disposed on the second insulating layer 92, a third insulating layer 93 covers the first conductive layer, and a second conductive layer is disposed on the third insulating layer 93. The second conductive layer at least includes a first shielding layer 31 and a second plate 32 of the storage capacitor. The second plate 32 of the storage capacitor is provided with an opening 34 which exposes the third insulating layer 93 covering the first plate 24, and there is an overlapping region between the orthographic projection of the second plate 32 on the substrate 10 and the orthographic projection of the first plate 24 on the substrate 10.

(15) A pattern of a second semi-conductive layer is formed. In an exemplary embodiment, forming a pattern of a second semi-conductive layer may include sequentially depositing a fourth insulating thin film and a second semiconductor thin film on the substrate on which the aforementioned pattern is formed, and patterning the second semiconductor thin film through a patterning process to form a fourth insulating layer 94 covering the substrate 10 and a pattern of the second semiconductor layer disposed on the fourth insulating layer 94 as shown in FIGS. 12A and 12B, wherein FIG. 12B is a sectional view taken along a B-B direction in FIG. 12A.

Figure 12A:
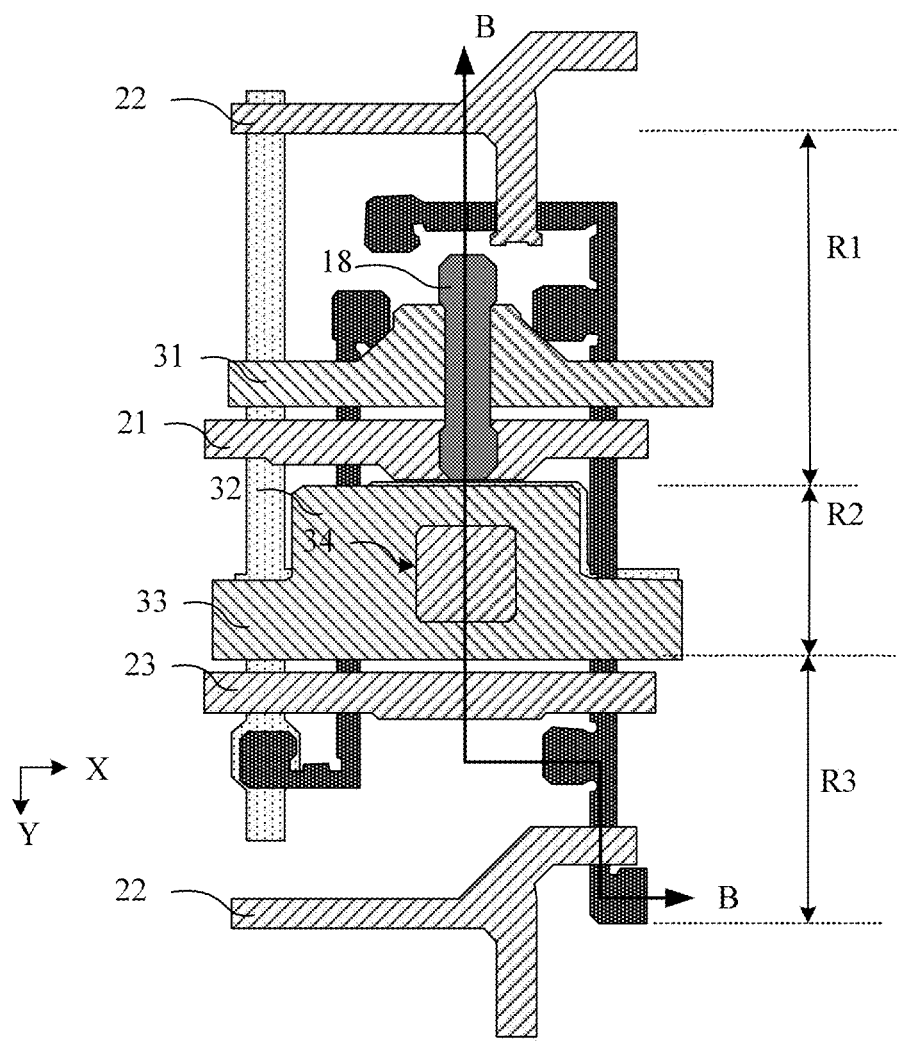
FIG. 12A is a schematic diagram of a display substrate after a pattern of a second semi-conductive layer is formed according to the present disclosure.
Figure 12B:
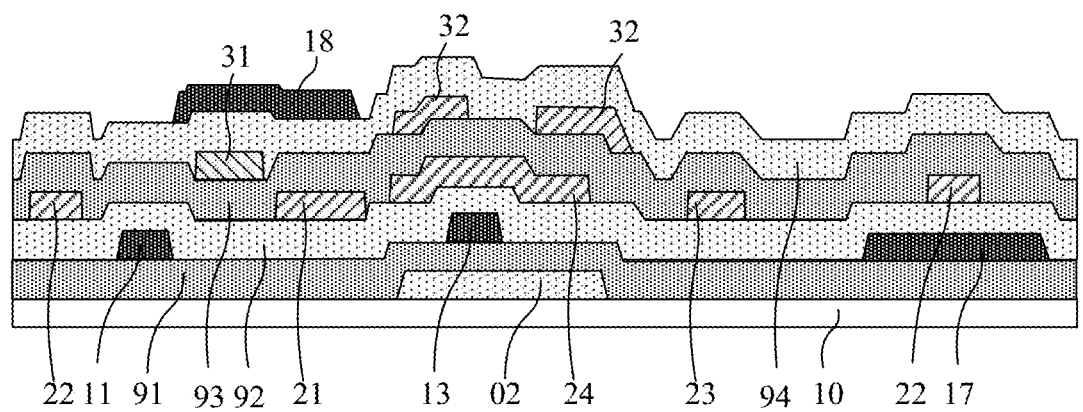
FIG. 12B is a sectional view taken along a B-B direction in FIG. 12A.

As shown in FIG. 12A, the second semi-conductive layer of each sub-pixel may include an eighth active layer 18 of an eighth transistor T8. In an exemplary embodiment, an eighth active layer 18 extends along a second direction Y and is disposed in a first region R1. The eighth active layer 18 may be I-shaped, and is located between a first active layer of a first transistor T1, a second active layer of a second transistor T2 and a fourth active layer of a fourth transistor T4.

In an exemplary embodiment, a first region of an eighth active layer 18 is adjacent to a first active layer of the first transistor T1, and a second region of the eighth active layer 18 is adjacent to the boundary line of a first region R1 and a second region R2.

In an exemplary embodiment, a second semi-conductive layer may use oxide, that is, an eighth transistor is an oxide thin film transistor.

As shown in FIG. 12B, in a direction perpendicular to a substrate, a light shielding layer is disposed on the substrate 10, a first insulating layer 91 is disposed on the light shielding layer, a first semi-conductive layer is disposed on the first insulating layer 91, a second insulating layer 92 covers the first semi-conductive layer, a first conductive layer is disposed on the second insulating layer 92, a third insulating layer 93 covers the first conductive layer, a second conductive layer is disposed on the third insulating layer 93, a fourth insulating layer 94 covers the second conductive layer, a second semi-conductive layer is disposed on the fourth insulating layer 94, and the second semi-conductive layer at least include an eighth active layer 18.

Figure 13A:
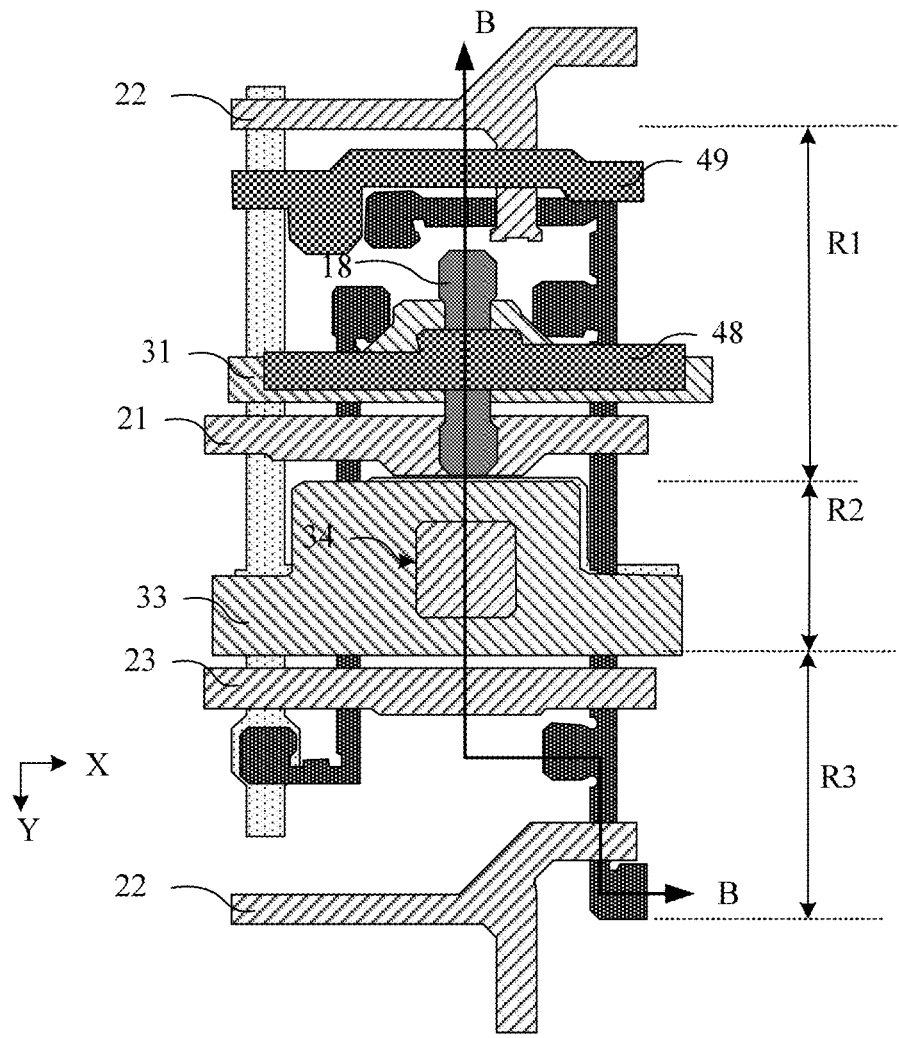
FIG. 13A is a schematic diagram of a display substrate after a pattern of a third conductive layer is formed according to the present disclosure.
Figure 13B:
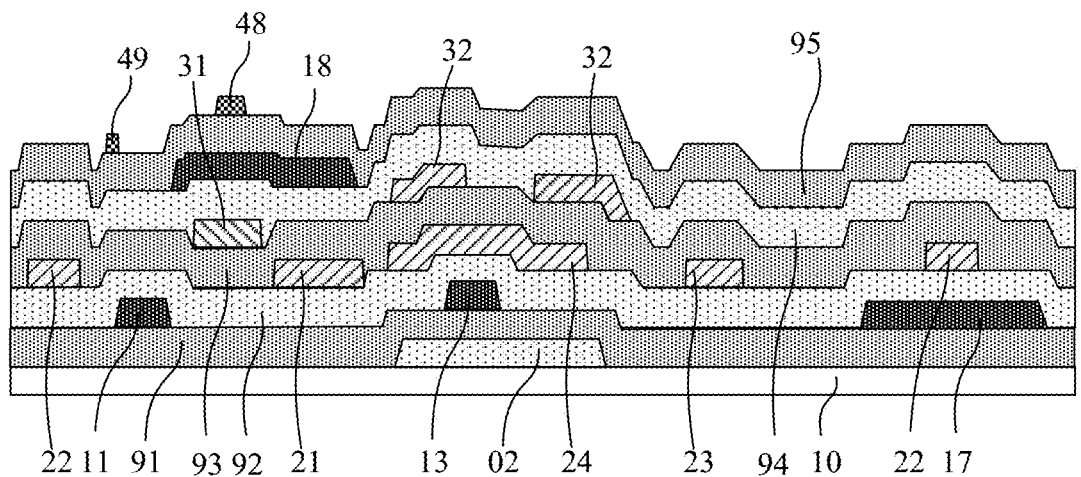
FIG. 13B is a sectional view taken along a B-B direction in FIG. 13A.

(16) A pattern of a third conductive layer is formed. In an exemplary embodiment, forming a pattern of a third conductive layer may include sequentially depositing a fifth insulating thin film and a third metal thin film on the substrate on which the aforementioned patterns are formed, and patterning the fifth insulating thin film and the third metal thin film through a patterning process to form a fifth insulating layer 95 disposed on the second semi-conductive layer and a pattern of a third conductive layer disposed on the fifth insulating layer 95; the pattern of the third conductive layer at least include a third scanning signal line 48 and a second initial signal line 49 as shown in FIGS. 13A and 13B, wherein FIG. 13B is a sectional view taken along a B-B direction in FIG. 13A. In an exemplary embodiment, the third conductive layer may be referred to as a third gate metal (GATE3) layer.

As shown in FIG. 13A, in an exemplary embodiment, a third scanning signal line 48 and a second initial signal line 49 extend along a first direction X and are disposed in a first region R1. The third scanning signal line 48 is close to a first scanning signal line 21 and the second initial signal line 49 is close to a second scanning signal line 22. In an exemplary embodiment, the region where a third scanning signal line 48 is overlapped with an eighth active layer serves as a gate electrode of an eighth transistor.

In an exemplary embodiment, an orthographic projection of a third scanning signal line 48 on a substrate 10 is overlapped with an orthographic projection of the first shielding layer 31 on the substrate 10; therefore, the first shielding layer 31 may be used as the shielding layer of the eighth transistor.

As shown in FIG. 13B, in a direction perpendicular to a substrate, a light shielding layer is disposed on the substrate 10, a first insulating layer 91 is disposed on the light shielding layer, a first semi-conductive layer is disposed on the first insulating layer 91, a second insulating layer 92 covers the first semi-conductive layer, a first conductive layer is disposed on the second insulating layer 92, a third insulating layer 93 covers the first conductive layer, a second conductive layer is disposed on the third insulating layer 93, a fourth insulating layer 94 covers the second conductive layer, a second semi-conductive layer is disposed on the fourth insulating layer 94, a fifth insulating layer 95 is disposed on the second semi-conductive layer, and a third conductive layer is disposed on the fifth insulating layer 95.

In an exemplary embodiment, the orthographic projection of a third scanning signal line 48 and a second initial signal line 49 on the substrate 10 is basically the same as the orthographic projection of a fifth insulating layer 95 on the substrate 10. Alternatively, the orthographic projection of the fifth insulating layer 95 on the substrate 10 may be expanded beyond he orthographic projection of the third scanning signal line 48 and the second initial signal line 49 on the substrate 10 to prevent the third scanning signal line 48 and the second initial signal line 49 from contacting an eighth active layer 18 in the manufacturing process. In an exemplary embodiment, the fifth insulating thin film does not have to be patterned, but only the third metal thin film may be patterned to form the fifth insulating layer 95 covering the second active layer 12, wherein the fifth insulating layer 95 covers the entire substrate.

(17) A sixth insulating layer is formed and a first etching treatment is performed. In an exemplary embodiment, performing a first etching process may include: depositing a sixth insulating thin film, patterning the sixth insulating thin film through a patterning process to form a sixth insulating layer 96 covering a third conductive layer, wherein a plurality of first groove groups are provided on the sixth insulating layer 96. There is an overlapping region between the orthographic projection of the first groove groups on the substrate 10 and the orthographic projection of the second active layer of the second transistor to the seventh active layer of the seventh transistor on the substrate 10, and the first groove group expose the third insulating layer above second active layer of the second transistor to the seventh active layer of the seventh transistor. In an exemplary embodiment, a plurality of first groove groups at least include a first groove S1, a second groove S2, a third groove S3, a fourth groove S4, and a fifth groove S5 as shown in FIGS. 14A and 14B, wherein FIG. 14B is a sectional view taken along B-B in along a B-B direction in FIG. 14A.

Figure 14A:
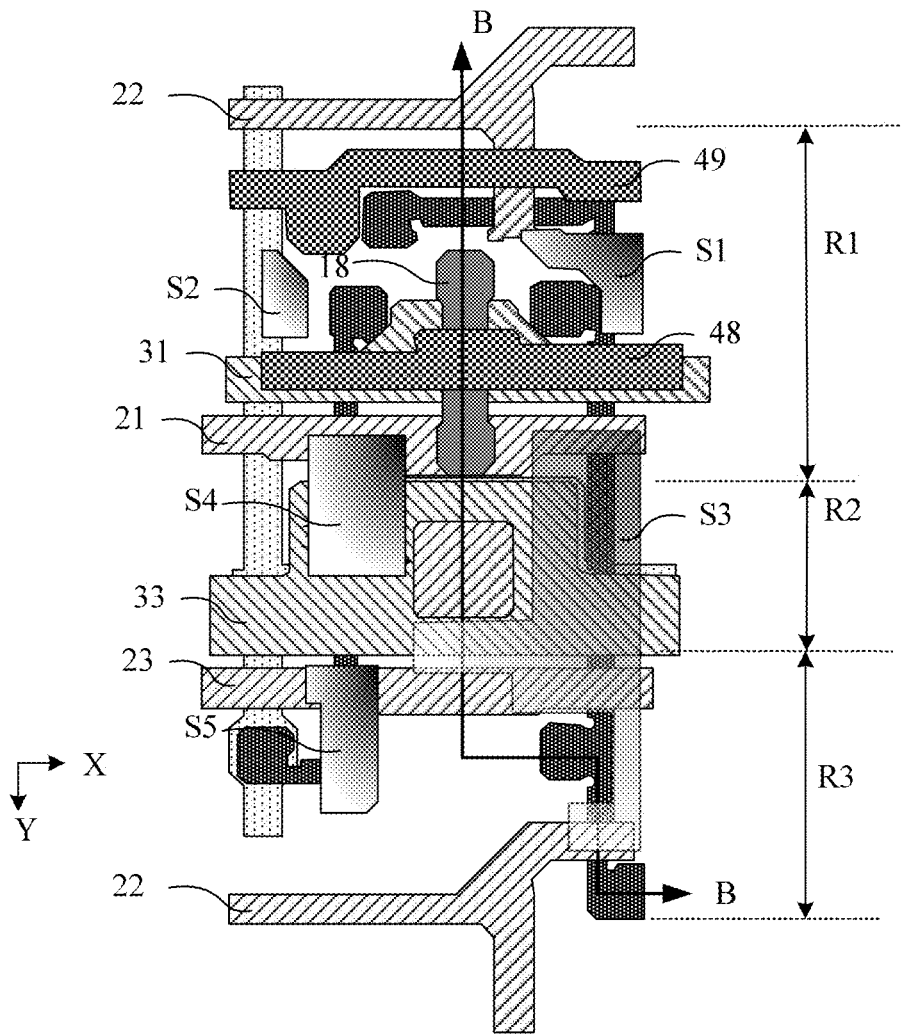
FIG. 14A is a schematic diagram of a display substrate after a sixth insulating layer is formed and a first etching treatment is performed according to the present disclosure.
Figure 14B:
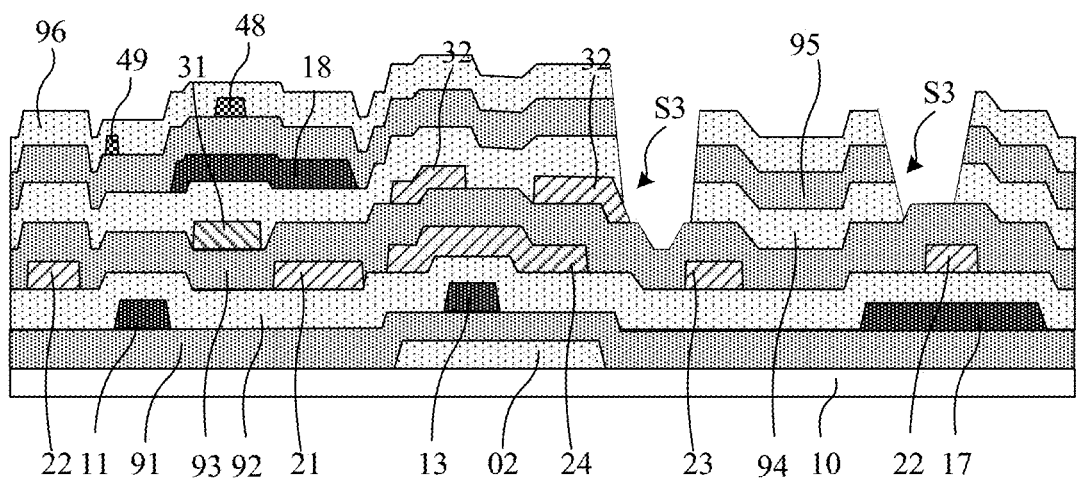
FIG. 14B is a sectional view taken along a B-B direction in FIG. 14A.

As shown in FIGS. 14A and 14B, in the exemplary embodiment, the first groove S1 and the second groove S2 are disposed in a first region R1 between a third scanning signal line 48 and a second initial signal line 49, the third groove S3 is disposed in a second region R2 and a third region R3, the fourth groove S4 is disposed in the first region R1 and the second region R2, and the fifth groove S5 is disposed in the third region R3.

In an exemplary embodiment, the orthographic projection of a first groove S1 on a substrate 10 is overlapped with the orthographic projection of a first active layer of a first transistor and a second active layer of a second transistor on the substrate 10, and a sixth insulating layer 96, a fifth insulating layer 95 and a fourth insulating layer 94 in the first groove S1 are etched away to expose the surface of the third insulating layer 93 above the first transistor T1 and the second transistor T2; the orthographic projection of a second groove S2 on the substrate 10 is close to a first region of a fourth active layer of a fourth transistor, the sixth insulating layer 96, the fifth insulating layer 95 and the fourth insulating layer 94 in the second groove S2 are etched away to expose the surface of the third insulating layer 93 near the first electrode of the fourth transistor T4; the orthographic projection of a third groove S3 on the substrate 10 is overlapped with the orthographic projection of a seventh active layer of a seventh transistor, the third active layer of the third transistor and the sixth active layer of the sixth transistor on the substrate 10, and the sixth insulating layer 96, the fifth insulating layer 95 and the fourth insulating layer 94 in the third groove S3 are etched away to expose the surfaces of the third insulating layer 93 above the seventh transistor T7, the third transistor T3 and the sixth transistor T6; the orthographic projection of a fourth groove S4 on the substrate 10 is overlapped with the orthographic projection of the fourth active layer of the fourth transistor on the substrate 10, and the sixth insulating layer 96, the fifth insulating layer 95 and the fourth insulating layer 94 in the fourth groove S4 are etched away to expose the surface of the third insulating layer 93 above the fourth transistor T4; and the orthographic projection of a fifth groove S5 on the substrate 10 is overlapped with the orthographic projection of a fifth active layer of a fifth transistor on the substrate 10, and the sixth insulating layer 96, the fifth insulating layer 95 and the fourth insulating layer 94 in the fifth groove S5 are etched away to expose the surface of the third insulating layer 93 above the fifth transistor T5.

As shown in FIG. 14B, in a direction perpendicular to a substrate, a light shielding layer is disposed on the substrate 10, a first insulating layer 91 is disposed on the light shielding layer, a first semi-conductive layer is disposed on the first insulating layer 91, a second insulating layer 92 covers the first semi-conductive layer, a first conductive layer is disposed on the second insulating layer 92, a third insulating layer 93 covers the first conductive layer, a second conductive layer is disposed on the third insulating layer 93, a fourth insulating layer 94 covers the second conductive layer, a second semi-conductive layer is disposed on the fourth insulating layer 94, a fifth insulating layer 95 is disposed on the second semi-conductive layer, a third conductive layer is disposed on the fifth insulating layer 95, a sixth insulating layer 96 covers the third conductive layer and is provided with a plurality of first groove groups, and the plurality of first groove groups may include first grooves S1 to fifth grooves S5.

(18) A second etching treatment of the sixth insulating layer 96 is performed to form patterns of the first via group and the second groove group. In an exemplary embodiment, forming a first via group and a second groove group may include: on the substrate on which the aforementioned patterns are formed, patterning sixth insulating thin film through a patterning process to form a plurality of first via groups and second groove groups, wherein the plurality of first via groups at least include: a first via V1, a second via V2, a third via V3, a fourth via V4, a fifth via V5, a sixth via V6, a seventh via V7 and an eighth via V8, the plurality of second groove group at least includes a sixth groove S6, a seventh groove S7, and an eighth groove S8, as shown in FIG. 15A and FIG. 15B, wherein FIG. 15B is a sectional view taken along a B-B direction in FIG. 15A.

Figure 15A:
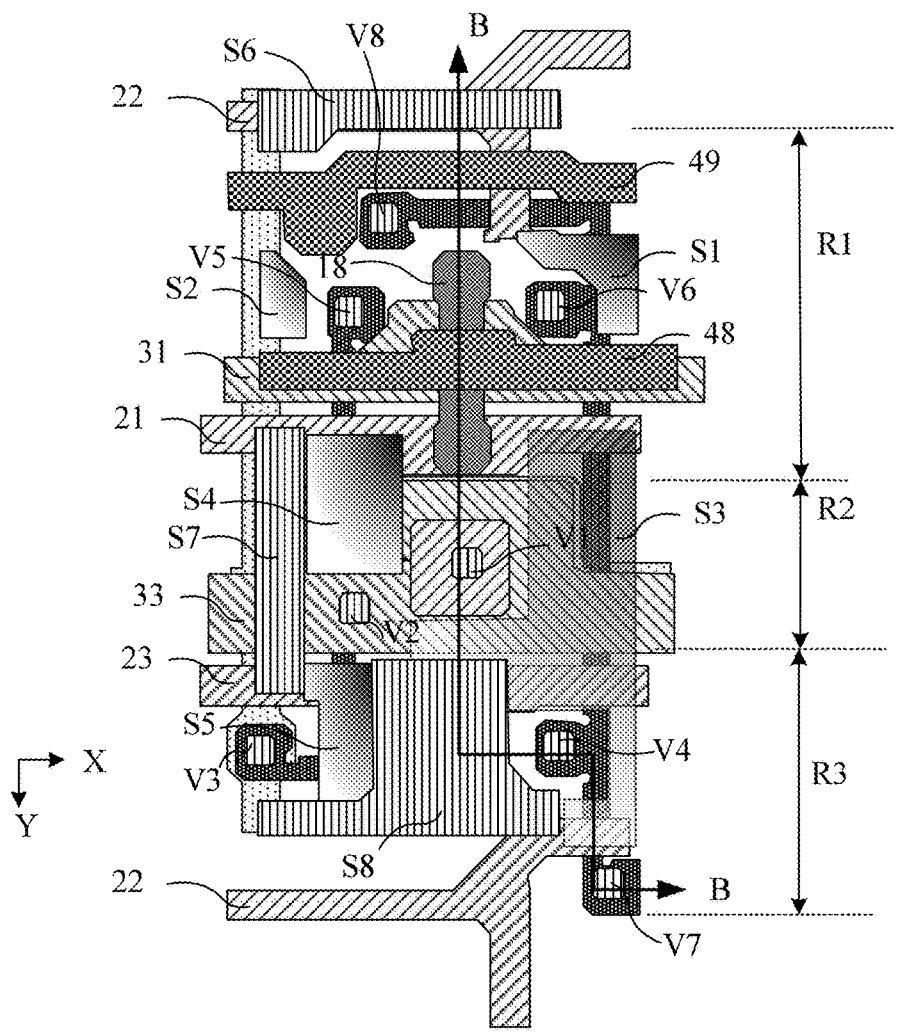
FIG. 15A is a schematic diagram of a display substrate after a second etching treatment for the sixth insulating layer according to the present disclosure.
Figure 15B:
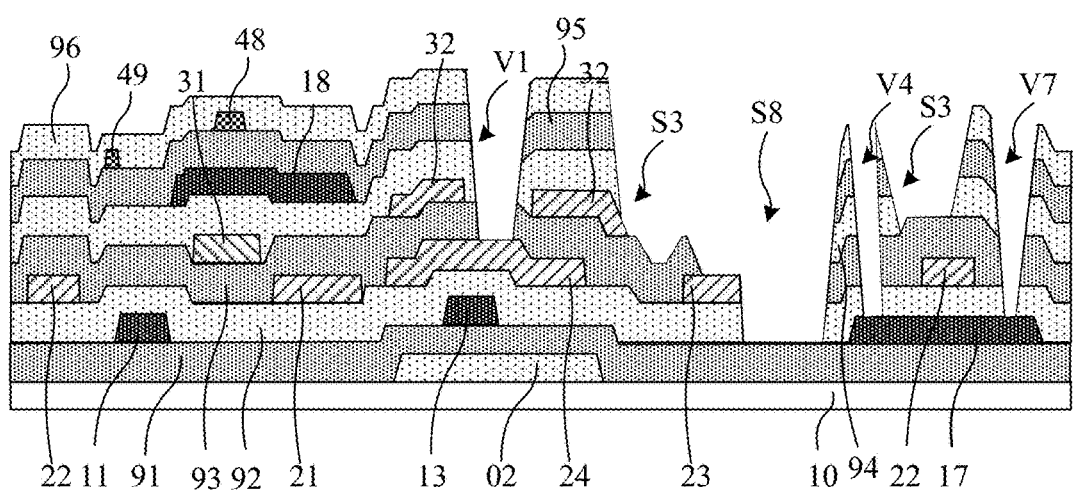
FIG. 15B is a sectional view taken along a B-B direction in FIG. 15A.

As shown in FIGS. 15A and 15B, in an exemplary embodiment, the first via V1 is located in the opening 34 of the second electrode plate 32, and an orthographic projection of the first via V1 on the substrate 10 is within a range of an orthographic projection of the opening 34 on the substrate. A sixth insulating layer 96, a fifth insulating layer 95, a fourth insulating layer 94 and a third insulating layer 92 in the first via V1 are etched away to expose a surface of the first electrode plate 24. The first via V1 is configured to allow a second electrode of a subsequently formed eighth transistor T8 to be connected with the first electrode plate 24 through the via V1.

In an exemplary embodiment, a second via V2 is located in the region where a second electrode plate 32 is located, and the orthographic projection of the second via V2 on the substrate 10 is within the range of the orthographic projection of the second electrode plate 32 on the substrate 10. A sixth insulating layer 96, a fifth insulating layer 95 and a fourth insulating layer 94 in the second via V2 are etched away to expose the surface of the second electrode plate 32. The second via V2 is arranged such that the subsequently formed first power supply line is connected to the second electrode plate 32 through the via V2. In an exemplary embodiment, a second via V2 as power supply via may be plural, and the plurality of second vias V2 may be sequentially disposed along the second direction Y, thereby increasing the connection reliability between the first power supply line and the second plate 32.

In an exemplary embodiment, a third via V3 is located in a third region R3, and a sixth insulating layer 96, a fifth insulating layer 95, a fourth insulating layer 94, a third insulating layer 93, and a second insulating layer 92 in the third via V3 are etched away to expose a surface of a first region of the fifth active layer. The third via V3 is arranged such that the first power supply line formed subsequently is connected to the fifth active layer through the via V3.

In an exemplary embodiment, a fourth via V4 is located in a third region R3, and a sixth insulating layer 96, a fifth insulating layer 95, a fourth insulating layer 94, a third insulating layer 93, and a second insulating layer 92 in the fourth via V4 are etched away to expose a surface of a second region of the sixth active layer (as well as a second region of the seventh active layer). The fourth via V4 is configured to allow a second electrode of the sixth transistor T6 subsequently formed to be connected to the sixth active layer through the via V4; and allow a second electrode of the seventh transistor T7 subsequently formed to be connected to the seventh active layer through the via V4.

In an exemplary embodiment, a fifth via V5 is located in a first region R1, and a sixth insulating layer 96, a fifth insulating layer 95, a fourth insulating layer 94, a third insulating layer 93, and a second insulating layer 92 in the fifth via V5 are etched away to expose a surface of a first region of the fourth active layer. The fifth via V5 is arranged such that the data signal line formed subsequently is connected to the fourth active layer through the via V5.

In an exemplary embodiment, a sixth via V6 is located in a first region R1, and a sixth insulating layer 96, a fifth insulating layer 95, a fourth insulating layer 94, a third insulating layer 93, and a second insulating layer 92 in the sixth via V6 are etched away to expose a surface of a first region of the second active layer (as well as a second region of the first active layer). The sixth via V6 is configured to allow a first electrode of the second transistor T2 (as well as the second electrode of the first transistor T1) subsequently formed to be connected to the second active layer through the via V6.

In an exemplary embodiment, a seventh via V7 is located in a third region R3, and a sixth insulating layer 96, a fifth insulating layer 95, a fourth insulating layer 94, a third insulating layer 93, and a second insulating layer 92 in the seventh via V7 are etched away to expose a surface of a first region of the seventh active layer. The seventh via V7 is configured to allow a first electrode of the seventh transistor T7 subsequently formed to be connected to the seventh active layer through the via V7.

In an exemplary embodiment, an eighth via V8 is located in a first region R1, and a sixth insulating layer 96, a fifth insulating layer 95, a fourth insulating layer 94, a third insulating layer 93, and a second insulating layer 92 in the eighth via V8 are etched away to expose a surface of a first region of the first active layer. The eighth via V8 is configured to allow a first electrode of the first transistor T1 subsequently formed to be connected to the second initial signal line 49 through the via V8.

As shown in FIGS. 15A and 15B, in an exemplary embodiment, A sixth groove S6 is disposed in a first region R1, a seventh groove S7 is disposed in a second region R2, and an eighth groove S8 is disposed in a third region R3.

In an exemplary embodiment, a sixth groove S6 may be L-shaped, a seventh groove S7 may be I-shaped, and an eighth groove S8 may be T-shaped.

In an exemplary embodiment, the orthographic projection of a sixth groove S6 on the substrate 10 is overlapped with the orthographic projection of a second scanning signal line 22 on the substrate 10, and a sixth insulating layer 96, a fifth insulating layer 95, a fourth insulating layer 94 and a third insulating layer 93 in the sixth groove S6 are etched away to exposed the surface of the second scanning signal line 22; a seventh groove S7 is disposed between a first scanning signal line 21 and an light emitting control signal line 23, and the sixth insulating layer 96, the fifth insulating layer 95, the fourth insulating layer 94 and the third insulating layer 93 in the seventh groove S7 are etched away to expose the surfaces of the first scanning signal line 21, the light emitting control line 23 and the plate connecting line 33; and an eighth groove S8 is disposed between a fifth active layer and a sixth active layer, and the sixth insulating layer 96, the fifth insulating layer 95, the fourth insulating layer 94, the third insulating layer 93 and the second insulating layer 92 in the eighth groove S8 are etched away to expose the surface of the first insulating layer 91.

As shown in FIG. 15B, in a direction perpendicular to a substrate, a light shielding layer is disposed on the substrate 10, a first insulating layer 91 is disposed on the light shielding layer, a first semi-conductive layer is disposed on the first insulating layer 91, a second insulating layer 92 covers the first semi-conductive layer, a first conductive layer is disposed on the second insulating layer 92, a third insulating layer 93 covers the first conductive layer, a second conductive layer is disposed on the third insulating layer 93, a fourth insulating layer 94 covers the second conductive layer, a second semi-conductive layer is disposed on the fourth insulating layer 94, a fifth insulating layer 95 is disposed on the second semi-conductive layer, a third conductive layer is disposed on the fifth insulating layer 95, a sixth insulating layer 96 covers the third conductive layer, and the sixth insulating layer 96 is provided with a plurality of first groove groups, first via groups and second groove groups, wherein the plurality of first via groups may include a first via V1 to an eighth via V8, and the plurality of second groove groups may include a sixth groove S6, a seventh groove S7, and an eighth groove S8.

(19) A third etching treatment for the sixth insulating layer 96 is performed to form patterns of the second via group and the third groove group. In an exemplary embodiment, forming patterns of a second via group and a third groove group patterns may include: forming a plurality of second via groups and third groove groups on the substrate on which the aforementioned patterns are formed through a patterning process, wherein the second via groups at least include a ninth via V9, a tenth via V10 and an eleventh via V11, and the plurality of third groove groups may include a ninth groove S9, a tenth groove S10, an eleventh groove S11, a twelfth groove S12 and a thirteenth groove S13, as shown in FIGS. 16A and 16B, wherein FIG. 16B is a sectional view taken along a B-B direction in FIG. 16A.

Figure 16A:
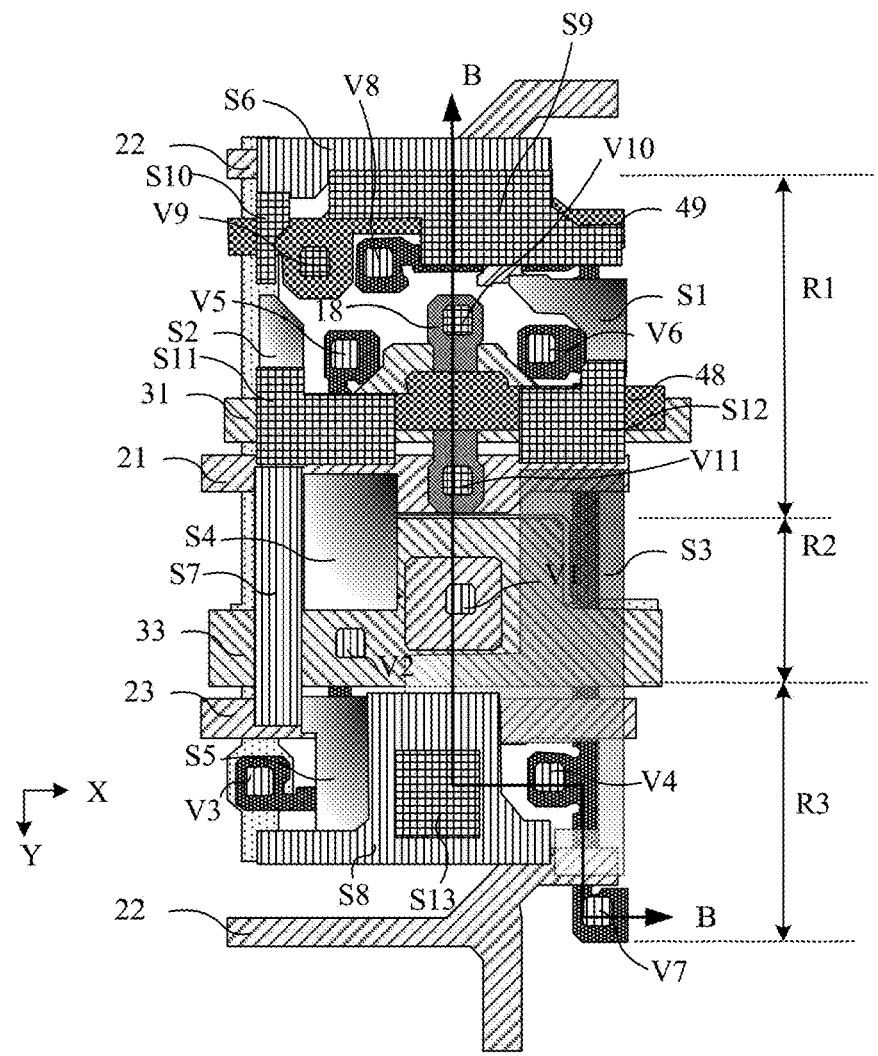
FIG. 16A is a schematic diagram of a display substrate after a third etching treatment for the sixth insulating layer according to the present disclosure.
Figure 16B:
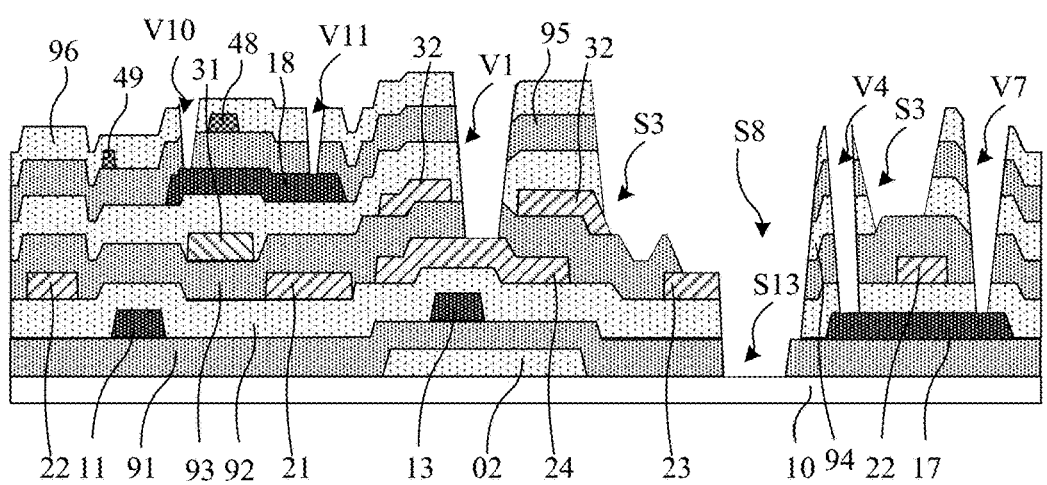
FIG. 16B is a sectional view taken along a B-B direction in FIG. 16A.

In an exemplary embodiment, as shown in FIGS. 16A and 16B, the ninth via V9, the tenth via V10 and the eleventh via V11 are all located in a first region R1, and the sixth insulating layer 96 and the fifth insulating layer 95 in the ninth via V9 are etched away to exposed the surface of a second initial signal line 49. The sixth insulating layer 96 and the fifth insulating layer 95 in the tenth via V10 are etched away to expose the surface of a first region of an eighth active layer. The sixth insulating layer 96 and the fifth insulating layer 95 in the eleventh via V11 are etched away to expose the surface of a second region of the eighth active layer.

In an exemplary embodiment, as shown in FIGS. 16A and 16B, a ninth groove S9, a tenth groove S10, an eleventh groove S11 and a twelfth groove S12 are all located in a first region R1, and the ninth groove S9 and the tenth groove S10 are located on both sides of the ninth via V9 and the eighth via V8 along the first direction X. The sixth insulating layer 96 and the fifth insulating layer 95 in the ninth groove S9 and the tenth groove S10 are etched away to respectively expose the surfaces of the second initial signal lines 49 on both sides of the ninth via V9 and the eighth via V8. The eleventh groove S11 and the twelfth groove S12 are respectively located on both sides of the eighth active layer 18 along the first direction X. The sixth insulating layer 96 and the fifth insulating layer 95 in the eleventh groove S11 and the twelfth groove S12 are etched away to respectively expose the surfaces of the third scanning signal lines 48 on both sides of the eighth active layer 18 along the first direction X. A thirteenth groove S13 is located in a third region R3. The orthographic projection of the thirteenth groove S13 on the substrate 10 is overlapped with the orthographic projection of the eighth groove S8 on the substrate 10. A first insulating layer 91 in the thirteenth groove S13 is etched away to expose the surface of the substrate 10.

As shown in FIG. 16B, in a direction perpendicular to a substrate, a light shielding layer is disposed on the substrate 10, a first insulating layer 91 is disposed on the light shielding layer, a first semi-conductive layer is disposed on the first insulating layer 91, a second insulating layer 92 covers the first semi-conductive layer, a first conductive layer is disposed on the second insulating layer 92, a third insulating layer 93 covers the first conductive layer, a second conductive layer is disposed on the third insulating layer 93, a fourth insulating layer 94 covers the second conductive layer, a second semi-conductive layer is disposed on the fourth insulating layer 94, a fifth insulating layer 95 is disposed on the second semi-conductive layer, a third conductive layer is disposed on the fifth insulating layer 95, a sixth insulating layer 96 covers the third conductive layer, and the sixth insulating layer 96 is provided with a plurality of first groove groups, first via groups, second groove groups, second via groups and third groove groups, wherein the plurality of second via groups may include a ninth via V9, a tenth via V10 and an eleventh via V11, and the plurality of third groove groups may include a ninth groove S9, a tenth groove S10, an eleventh groove S11, a twelfth via S12 and a thirteenth via S13.

(20) Filling with an organic layer 97. In an exemplary embodiment, filling with an organic layer 97 may include, on the substrate on which the aforementioned patterns are formed, filling the regions other than the first via group and the second via group with the organic layer, as shown in FIGS. 17A and 17B, wherein FIG. 17B is a sectional view taken along a B-B direction in FIG. 17A.

Figure 17A:
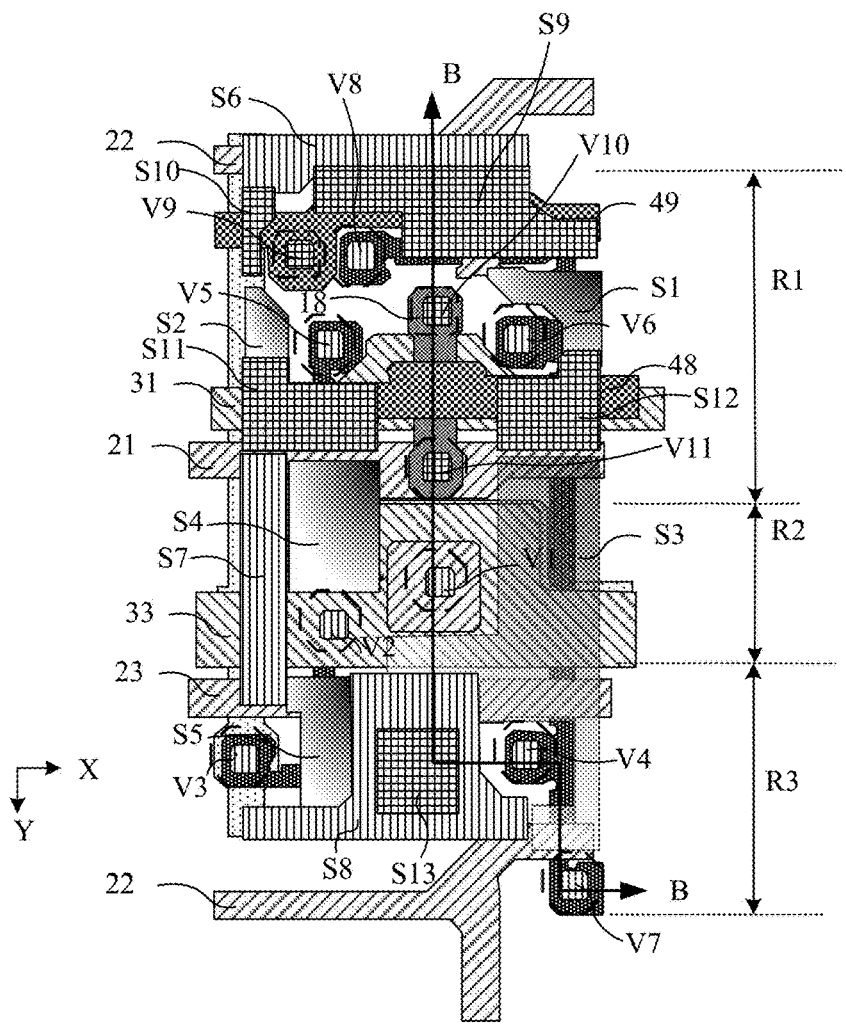
FIG. 17A is a schematic diagram of a display substrate after an organic layer is formed according to the present disclosure.
Figure 17B:
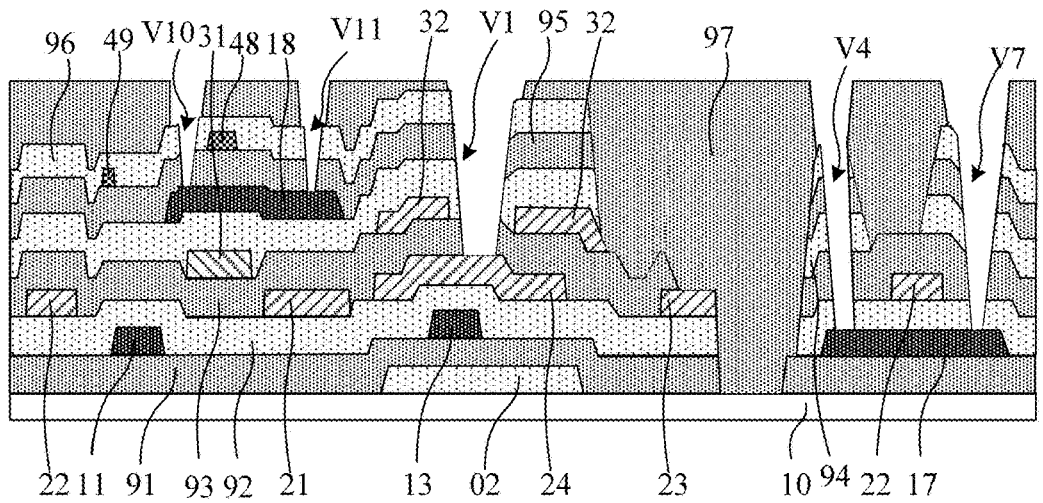
FIG. 17B is a sectional view taken along a B-B direction in FIG. 17A.

As shown in FIGS. 17A and 17B, in a direction perpendicular to a substrate, a light shielding layer is disposed on the substrate 10, a first insulating layer 91 is disposed on the light shielding layer, a first semi-conductive layer is disposed on the first insulating layer 91, a second insulating layer 92 covers the first semi-conductive layer, a first conductive layer is disposed on the second insulating layer 92, a third insulating layer 93 covers the first conductive layer, a second conductive layer is disposed on the third insulating layer 93, a fourth insulating layer 94 covers the second conductive layer, a second semi-conductive layer is disposed on the fourth insulating layer 94, a fifth insulating layer 95 is disposed on the second semi-conductive layer, a third conductive layer is disposed on the fifth insulating layer 95, a sixth insulating layer 96 covers the third conductive layer, an organic layer 97 is disposed on the sixth insulating layer 96, and the orthographic projection of the organic layer 97 on the substrate 10 is not overlapped with the orthographic projections of the first to eighth vias V1 to V8 and the ninth via V9 to the eleventh via V11 on the substrate 10.

(21) A pattern of a fourth conductive layer is formed. In an exemplary embodiment, forming a fourth conductive layer may include: depositing a fourth metal thin film on the substrate on which the aforementioned patterns are formed, and patterning the fourth metal thin film through a patterning process to form a fourth conductive layer disposed on the organic layer 97, a fourth conductive layer at least include a power connecting line 51, a first initial signal line 52, a fifth connection electrode 53, a sixth connection electrode 54, a seventh connection electrode 55, an eighth connection electrode 56 and a ninth connection electrode 57, as shown in FIGS. 7A and 7B, wherein FIG. 7B is a sectional view taken along a B-B direction in FIG. 7A. In an exemplary embodiment, a fourth conductive layer may be referred to as a first source-drain metal (SD1) layer.

As shown in FIG. 7A, in an exemplary embodiment, a folded power connecting line 51 is disposed in a second region R2 and a third region R3, which is connected to a second plate 32 through a second via V2 on the one hand, and is connected to a fifth active layer through a third via V3 on the other hand. The power connecting line 51 is configured to be connected with a later formed first power supply line.

In an exemplary embodiment, a first initial signal line 52 extends along the first direction X and is disposed in the third region R3. The first initial signal line 52 is connected to a first region of a seventh active layer through a seventh via V7, so that a first electrode of a seventh transistor T7 has the same potential as the first initial signal line 52.

In an exemplary embodiment, a fifth connection electrode 53 may be I-shaped and disposed in a first region R1 and a second region R2. A first end of the fifth connection electrode 53 is connected to a first plate 24 through a first via V1, and a second end of the fifth connection electrode 53 is connected to a second region of an eighth active layer through an eleventh via V11, so that the first plate 24 and the second electrode of the eighth transistor T8 have the same potential. In an exemplary embodiment, a fifth connection electrode 53 may serve as the second electrode of the eighth transistor T8.

In an exemplary embodiment, a sixth connection electrode 54 may be rectangular and disposed in a first region R1. On the one hand, the sixth connection electrode 54 is connected with a first region of a second active layer (which is also a second region of a first active layer) through a sixth via V6, and on the other hand, the sixth connection electrode 54 is connected with a first region of an eighth active layer through a tenth via V10, so that the first electrode of the second transistor T2, the second electrode of the first transistor T1 and the first electrode of the eighth transistor T8 have the same potential. In an exemplary embodiment, the sixth connection electrode 54 may serve as the first electrode of the second transistor T2 and the second electrode of the first transistor T1.

In an exemplary embodiment, a seventh connection electrode 55 may be rectangular and disposed in a third region R3. The seventh connection electrode 55 is connected to a second region of a sixth active layer (which is also a second region of a seventh active layer) through a fourth via V4, so that a second electrode of the sixth transistor T6 and a second electrode of the seventh transistor T7 have the same potential. In an exemplary embodiment, the seventh connection electrode 55 may serve as the second electrode of the sixth transistor T6 and the second electrode of the seventh transistor T7. In an exemplary embodiment, the seventh connection electrode 55 is configured to be connected to a subsequently formed anode connection electrode.

In an exemplary embodiment, an eighth connection electrode 56 may be rectangular and disposed in the first region R1. The eighth connection electrode 56 is connected to a first region of a fourth active layer through a fifth via V5. In an exemplary embodiment, the eighth connection electrode 56 is configured to be connected with a data signal line formed later, so that the data signal transmitted by the data signal line is written into the fourth transistor T4.

In an exemplary embodiment, a ninth connection electrode 57 extends along the first direction X and is disposed in a first region R1. On the one hand, the ninth connection electrode 57 is connected to a first region of a first active layer through an eighth via V8, and on the other hand, the ninth connection electrode 57 is connected to a second initial signal line 49 through a ninth via V9, so that a first electrode of a first transistor T1 has the same potential as the second initial signal line 49.

As shown in FIG. 7B, in a direction perpendicular to a substrate, a light shielding layer is disposed on the substrate 10, a first insulating layer 91 is disposed on the light shielding layer, a first semi-conductive layer is disposed on the first insulating layer 91, a second insulating layer 92 covers the first semi-conductive layer, a first conductive layer is disposed on the second insulating layer 92, a third insulating layer 93 covers the first conductive layer, a second conductive layer is disposed on the third insulating layer 93, a fourth insulating layer 94 covers the second conductive layer, a second semi-conductive layer is disposed on the fourth insulating layer 94, a fifth insulating layer 95 is disposed on the second semi-conductive layer, a third conductive layer is disposed on the fifth insulating layer 95. A sixth insulating layer 96 covers the third conductive layer, a plurality of vias are provided on the sixth insulating layer 96, an organic layer 97 is disposed on the sixth insulating layer 96, wherein the orthographic projection of the organic layer 97 on the substrate 10 does not overlap with the orthographic projection of the plurality of vias on the substrate 10. A fourth conductive layer is disposed on the organic layer 97, wherein the fourth conductive layer at least includes a fifth connection electrode 53, a sixth connection electrode 54 and a seventh connection electrode 55. The seventh connection electrode 55 is connected to one end of the sixth active layer through a fourth via V4. The sixth connection electrode 54 is connected to the other end of the sixth active layer through a sixth via V6 on the one hand, and is connected to one end of the second active layer through a tenth via V10 on the other hand. The fifth connection electrode 53 is connected to a first electrode plate 24 through a first via V1 on the one hand, and is connected to the other end of an eighth active layer through an eleventh via V11 on the other hand.

(22) Patterns of a seventh insulating layer and a first planarization layer are formed. In an exemplary embodiment, forming patterns of a seventh insulating layer and a first planarization layer may include: depositing a seventh insulating thin film on the substrate on which the aforementioned patterns are formed, coating a first planarization thin film, and patterning the seventh insulating thin film and the first planarization thin film through a patterning process to form a seventh insulating layer covering the fourth conductive layer and a first planarization layer covering the seventh insulating layer. The seventh insulating layer and the first planarization layer are provided with a plurality of vias, which at least include a twentieth via, a 21st via, and a 22nd via.

The twentieth via is located in the region where a seventh connection electrode is located, the first planarization layer and the seventh insulating layer in the twentieth via are removed to expose the surface of the seventh connection electrode, and the twentieth via is configured to allow the anode connection electrode formed subsequently to be connected with the seventh connection electrode. The 21st via is located in the region where an eighth connection electrode is located, the first planarization layer and the seventh insulating layer in the 21st via are removed to expose the surface of the eighth connection electrode, and the 21st via is configured to allow the data signal line formed subsequently to be connected with the eighth connection electrode. The 22nd via is located in the region where a power connecting line is located, the first planarization layer and the seventh insulating layer in the 22nd via are removed to expose the surface of the power connecting line, and the 22nd via is configured to allow the first power supply line formed subsequently to be connected with the power connecting line.

(23) A pattern of a fifth conductive layer is formed. In an exemplary embodiment, forming a pattern of a fifth conductive layer may include depositing a fifth metal thin film on the substrate on which the aforementioned patterns are formed, patterning the fifth metal thin film through a patterning process to form a fifth conductive layer disposed on the first planarization layer, wherein the fifth conductive layer at least include a data signal line, a first power supply line, and an anode connection electrode. In an exemplary embodiment, a fifth conductive layer may be referred to as a second source-drain metal (SD2) layer.

The data signal line extends along the second direction Y, and the data signal line is connected to an eighth connection electrode through the 21st via. Because the eighth connection electrode is connected with the first region of the fourth active layer through the fifth via, the connection between the data signal line and the first electrode of the fourth transistor is achieved, and the data signal transmitted by the data signal line is written into the fourth transistor. The first power supply line extends along the second direction Y and is connected with the power connecting line through the 22nd via, so that the power connecting line has the same potential as the first power supply line. The anode connection electrode may be rectangular, connected with the seventh connection electrode through the twentieth via, and configured to be connected with the subsequently formed anode.

(24) A pattern of a second planarization layer is formed. In an exemplary embodiment, forming a pattern of a second planarization layer may include: coating a second planarization thin film on the substrate on which the aforementioned patterns are formed, patterning the second planarization thin film through a patterning process to form a second planarization layer covering the fifth conductive layer, and the second planarization layer is at least provided with a 23rd via, as shown in FIG. 25.

In an exemplary embodiment, the 23rd via is located in the region where the anode connection electrode is located, the second planarization layer in the 23rd via is removed to expose the surface of the anode connection electrode, and the 23rd via is configured to allow the anode formed subsequently to be connected with the anode connection electrode.

(25) A pattern of an anode is formed. In an exemplary embodiment, forming a pattern of an anode may include depositing a transparent conductive thin film on the substrate on which the aforementioned patterns are formed, and patterning the transparent conductive thin film through a patterning process to form the anode disposed on the second planarization layer.

In an exemplary embodiment, the anode has a hexagonal shape, and the anode is connected to the anode connection electrode through the a 23rd via. Because the anode connection electrode is connected with the seventh connection electrode through the twentieth via and the seventh connection electrode is connected with the sixth active layer through the fourth via, so that the pixel drive circuit can drive the light emitting element to emit light.

In an exemplary embodiment, a subsequent manufacturing process may include: coating a pixel define thin film, and patterning the pixel define thin film through the patterning process to form a pixel define layer. A pixel opening exposing the anode is provided in the pixel define layer of each sub-pixel. Subsequently, an organic light emitting layer is formed by an evaporation or ink jet printing process, and a cathode is formed on the organic light emitting layer. A encapsulation layer is formed, wherein the encapsulation layer may include a first encapsulation layer, a second encapsulation layer and a third encapsulation layer stacked, the first encapsulation layer and the third encapsulation layer may be made of an inorganic material, the second encapsulation layer may be made of an organic material, and the second encapsulation layer is disposed between the first encapsulation layer and the third encapsulation layer to ensure that the external water vapor cannot enter the light emitting structure layer.

In an exemplary embodiment, a subsequent manufacturing process may include: coating a pixel define thin film, and patterning the pixel define thin film through the patterning process to form a pixel define layer. A pixel opening exposing the anode is provided in the pixel define layer of each sub-pixel. Subsequently, an organic light emitting layer is formed by an evaporation or ink jet printing process, and a cathode is formed on the organic emitting layer. A encapsulation layer is formed, wherein the encapsulation layer may include a first encapsulation layer, a second encapsulation layer and a third encapsulation layer stacked, the first encapsulation layer and the third encapsulation layer may be made of an inorganic material, the second encapsulation layer may be made of an organic material, and the second encapsulation layer is disposed between the first encapsulation layer and the third encapsulation layer to ensure that the external water vapor cannot enter the light emitting structure layer.

In an exemplary implementation, the substrate may be a flexible substrate or may be a rigid substrate. The rigid substrate may be, but is not limited to, one or more of glass and quartz. The flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary embodiment, the flexible substrate may include a first flexible material layer, a first inorganic material layer, a semi-conductive layer, a second flexible material layer and a second inorganic material layer which are stacked, wherein materials of the first flexible material layer and the second flexible material layer may be polyimide (PI), polyethylene terephthalate (PET) or a polymer soft thin film with surface treatment; materials of the first inorganic material layer and the second inorganic material layer may be silicon nitride (SiNx) or silicon oxide (SiOx), etc., for improving the water-resistance and oxygen-resistance of the substrate; and the material of the semi-conductive layer may be amorphous silicon (a-si).

In an exemplary embodiment, the first conductive layer, the second conductive layer, the third conductive layer and the fourth conductive layer may be made of metal materials, such as any one or more of silver (Ag), copper (Cu), aluminum (Al) and molybdenum (Mo), or alloy materials of the above metals, such as aluminum neodymium alloy (AlNd) or molybdenum niobium alloy (MoNb), and may be a single-layer structure or a multi-layer composite structure, such as Mo/Cu/Mo. The first insulating layer, the second insulating layer, the third insulating layer, the fourth insulating layer, and the fifth insulating layer may be made of any one or more of silicon oxide (SiOx), silicon nitride (SiNx) and silicon oxynitride (SiON), and may be a single layer, a multilayer, or a composite layer. The first insulating layer is referred to as the first buffer layer, which is used to improve the water and oxygen resistance of the substrate, the second insulating layer is referred to as the first gate insulating (GI1) layer, and the third insulating layer is referred to as the second gate insulating layer (GI2) layer, the fourth insulating layer is referred to as the second buffer layer, the fifth insulating layer is referred to as the third gate insulating (GI3) layer, and the sixth insulating layer is referred to as the interlayer insulating (ILD) layer. The planarization layer may be made of an organic material, and the transparent conducting thin film may be made of indium tin oxide ITO or indium zinc oxide IZO. The active layer maybe made of polysilicon (p-Si), that is, the present disclosure is applicable to LTPS thin film transistors.

According to the display substrate of the embodiment of the present disclosure, the inorganic layer is etched to a large extent and is filled with organic layers, so that the fracture caused by stress concentration of the inorganic film during folding or curling is reduced, and the bending performance is improved. While ensuring the characteristics of transistors, the embodiment of the present disclosure only adds an inorganic layer etching process, and other inorganic layer etching processes are synchronously completed by the existing process, which has high compatibility with the existing scheme.

The structure of the display substrate and its preparation process in the present disclosure are only exemplary description. In an exemplary implementation, variation of corresponding structures and addition or reduction of the patterning process may be performed as practically required, which is not limited in the present disclosure.

In another exemplary implementation mode, the preparation process of the display substrate may include the following operations.

Figure 18A:
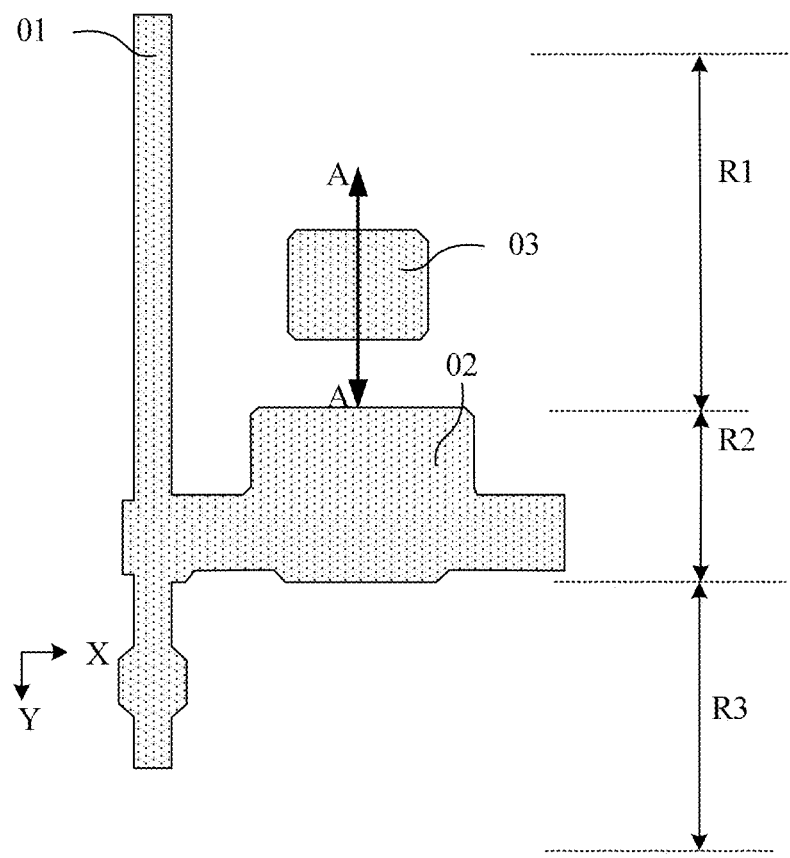
FIG. 18A is another schematic diagram of a display substrate after a pattern of a light shield layer is formed according to the present disclosure.
Figure 18B:
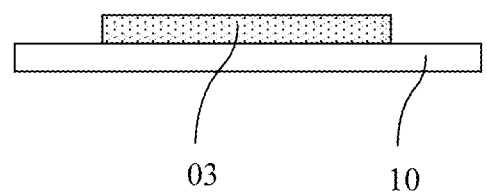
FIG. 18B is a sectional view taken along an A-A direction in FIG. 18A.

(31) A pattern of a light shielding layer is formed. In an exemplary embodiment, forming a pattern of a light shielding layer may include depositing a light shielding thin film on the substrate 10; coating a layer of photoresist on the light shielding thin film, exposing and developing the photoresist with a single tone mask, forming a unexposed region with remaining photoresist at the position of the pattern of the light shielding layer and forming fully exposed regions without photoresist at other positions to expose the light shielding thin film; etching the light shielding thin film in the fully exposed regions and stripping the remaining photoresist to form a pattern of the light shielding layer on the substrate 10, as shown in FIG. 18A and FIG. 18B, wherein FIG. 18B is a sectional view taken along an A-A direction in FIG. 18A. Wherein, the light shielding thin film may adopt one of metals such as silver Ag, molybdenum Mo, aluminum Al, copper Cu, etc., or a composite layer structure of a plurality of metals, such as Mo/Cu/Mo.

In an exemplary embodiment, as shown in FIGS. 18A and 18B, a light shielding layer of each sub-pixel may include a first light shielding layer 01, a second light shielding layer 02, and a third light shielding layer 03, the first light shielding layer 01 is disposed in a first region R1, a second region R2 and a third region R3, and the first light shielding layer 01 extends along a second direction Y; the second light shielding layer 02 is disposed in the second region R2, and the second light shielding layer 02 extends along a first direction X, wherein the first direction X intersects with the second direction Y; and the third light shielding layer 03 is disposed in the first region R1, the third light shielding layer 03 may be rectangular, and corners of the rectangle may be arranged with chamfer. There is an overlapping region between an orthographic projection of third light shielding layer 03 on the substrate 10 and an orthographic projection of the sinking groove 93-1 on the third insulating layer 93 formed subsequently on the substrate 10.

In an exemplary embodiment, the first light shielding layer 01 and the second light shielding layer 02 may be an integrated structure connected with each other.

(32) A pattern of a first semi-conductive layer is formed. This step is similar to the previous step (12), and the detailed preparation process may be referred to the above, which will not be repeated here.

(33) A pattern of a first conducting layer is formed. This step is similar to the previous step (13), and the detailed preparation process may be referred to the above, which will not be repeated here.

Figure 19A:
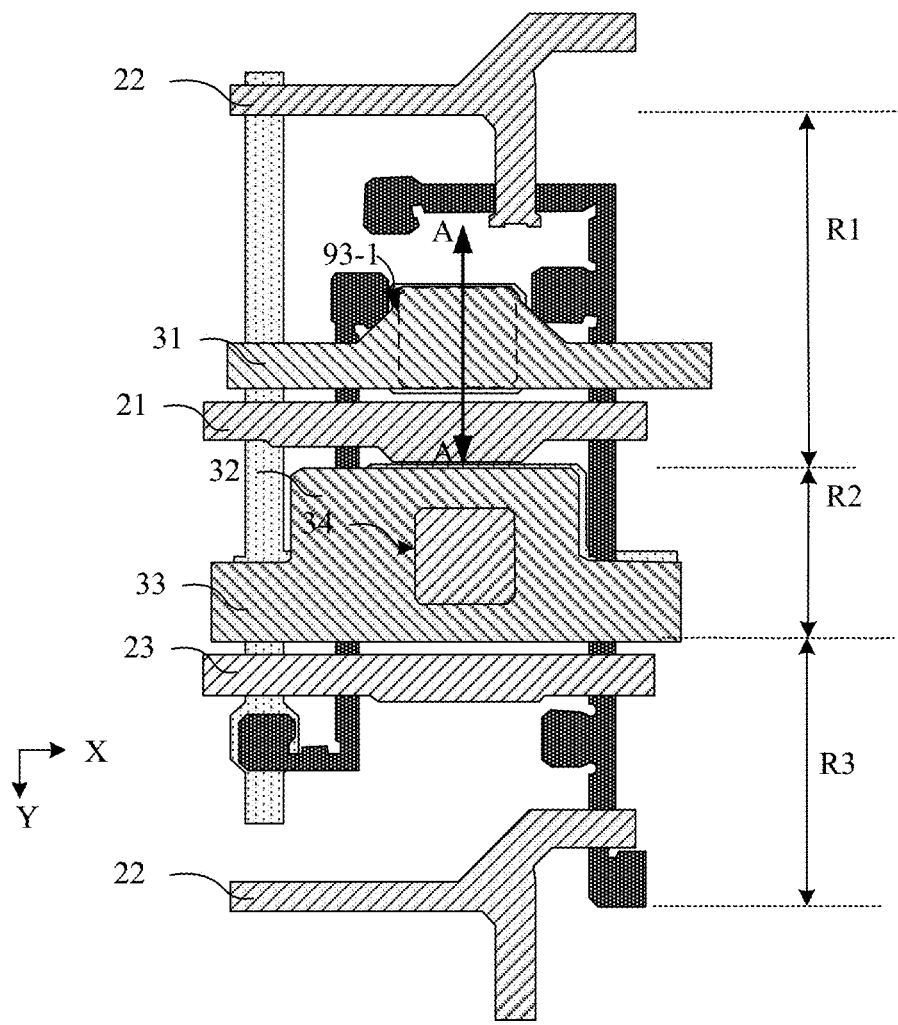
FIG. 19A is another schematic diagram of a display substrate after a pattern of a second conductive layer is formed according to the present disclosure.
Figure 19B:
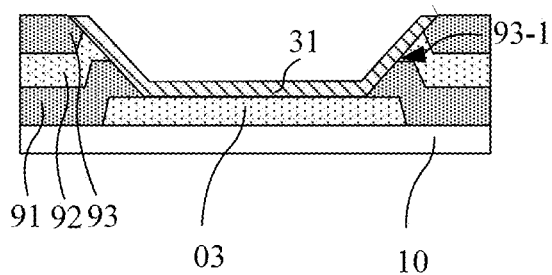
FIG. 19B is a sectional view taken along an A-A direction in FIG. 19A.

(34) A pattern of a second conductive layer is formed. In an exemplary embodiment, forming a pattern of a second conductive layer may include sequentially depositing a third insulating thin film and a second metal thin film on the substrate on which the aforementioned patterns are formed, and patterning the third insulating thin film and the second metal thin film through a patterning process to form a third insulating layer 93 covering the first conductive layer and a pattern of a second conductive layer disposed on the third insulating layer 93 as shown in FIG. 19A and FIG. 19B, wherein FIG. 19B is a sectional view taken along an A-A direction in FIG. 19A. The third insulating layer 93 at least includes a sinking groove 93-1, and the third insulating layer 93, the second insulating layer 92 and the first insulating layer 91 in the sinking groove 93-1 are etched away, exposing the surface of the third light shielding layer 03, so that when the subsequent oxide transistors are formed, the position of the oxide transistors will sink, thereby reducing the thickness of the display substrate and further reducing the size of the display products. The pattern of the second conductive layer is similar to that in the previous step (14), and the detailed preparation process may be referred to the above, which will not be repeated here.

(35) A pattern of a second semi-conductive layer is formed. This step is similar to the previous step (15), and the detailed preparation process may be referred to the above, which will not be repeated here.

(36) A pattern of a third conductive layer is formed. This step is similar to the previous step (16), and the detailed preparation process may be referred to the above, which will not be repeated here.

(37) A sixth insulating layer is formed and a first etching treatment is performed. This step is similar to the previous step (17), and the detailed preparation process may be referred to the above, which will not be repeated here.

(38) A second etching treatment for the sixth insulating layer 96 is performed to form patterns of the first via group and the second groove group. This step is similar to the previous step (18), and the detailed preparation process may be referred to the above, which will not be repeated here.

(39) A third etching treatment for the sixth insulating layer 96 is performed to form patterns of the second via group and the third groove group. This step is similar to the previous step (19), and the detailed preparation process may be referred to the above, which will not be repeated here.

(40) Filling with an organic layer 97. This step is similar to the previous step (20), and the detailed preparation process may be referred to the above, which will not be repeated here.

Figure 20A:
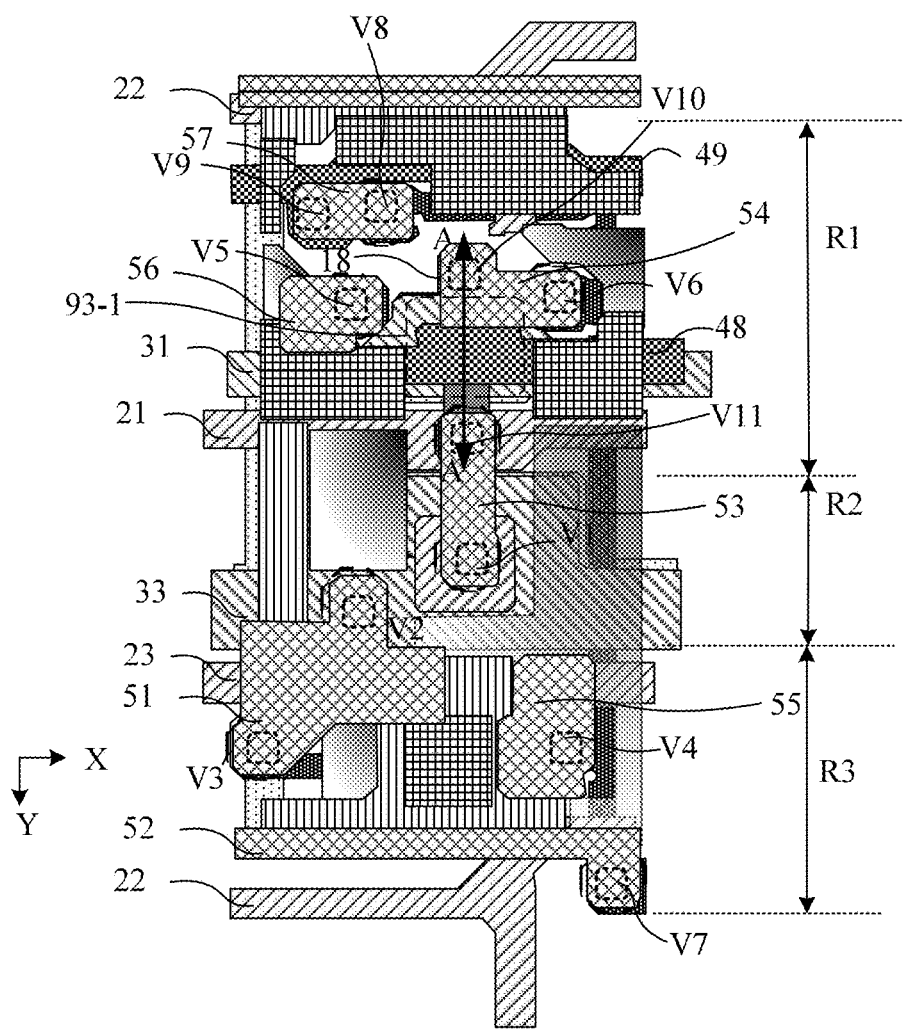
FIG. 20A is another schematic diagram of a display substrate after a pattern of a fourth conductive layer is formed according to the present disclosure.
Figure 20B:
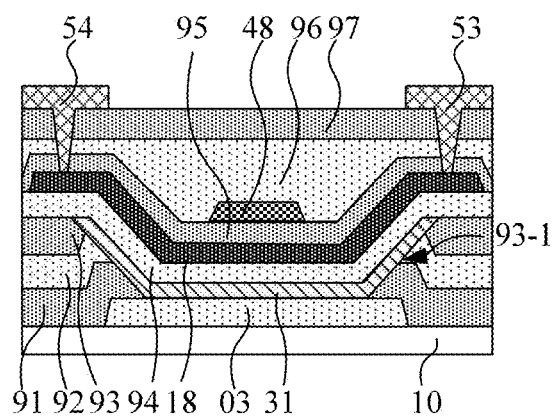
FIG. 20B is a sectional view taken along an A-A direction in FIG. 20A.

(41) A pattern of a fourth conductive layer is formed. This step is similar to the previous step (21), and the detailed preparation process may be referred to the above, which will not be repeated here. The above may be seen from FIGS. 20A and 20B, wherein FIG. 20B is a sectional view taken along a B-B direction in FIG. 20A.

(42) Patterns of a seventh insulating layer and a first planarization layer are formed. This step is similar to the previous step (22), and the detailed preparation process may be referred to the above, which will not be repeated here.

(43) A pattern of a fifth conductive layer is formed. This step is similar to the previous step (23), and the detailed preparation process may be referred to the above, which will not be repeated here.

(44) A pattern of a second planarization layer is formed. This step is similar to the previous step (24), and the detailed preparation process may be referred to the above, which will not be repeated here.

(45) A pattern of an anode is formed. This step is similar to the previous step (25), and the detailed preparation process may be referred to the above, which will not be repeated here.

The display substrate according to this embodiment is an extension of the previous embodiments, and basically has a same main structure as the previous embodiments. The difference lies in that the light shielding layer of this embodiment includes a pattern of a third light shielding layer and the third insulating layer 93 includes the sinking groove 93-1. Embodiments of the present disclosure also achieves the technical effects of the foregoing embodiments by etching the inorganic layer to a large extent and filling it with organic layers, so that the fracture caused by stress concentration of the inorganic film during folding or curling is reduced, and the bending performance is improved. While ensuring the characteristics of transistors, the embodiment of the present disclosure only adds an inorganic layer etching process, and other inorganic layer etching processes are synchronously completed by the existing process, which has high compatibility with the existing scheme. In addition, because the third insulating layer is provided with a sinking groove, the height of the oxide transistor from the substrate is reduced, thereby reducing the thickness of the display substrate and further reducing the size of the display product.

An exemplary embodiment of the present disclosure further provides a preparation method for a display substrate. In an exemplary embodiment, the method may include:

forming a light shielding layer on a substrate;

sequentially forming a first insulating layer and a first semi-conductive layer on the light shielding layer, wherein the first semi-conductive layer includes an active layer of at least one polysilicon transistor, sequentially forming a second insulating layer and a first conductive layer on the first semi-conductive layer, wherein the first conductive layer includes at least one gate electrode of a polysilicon transistor and a first plate of a storage capacitor, sequentially forming a third insulating layer and a second conductive layer on the first conductive layer, wherein the second conductive layer includes a second plate of a storage capacitor, sequentially forming a fourth insulating layer and a second semi-conductive layer on the second conductive layer, wherein the second semi-conductive layer includes an active layer of at least one oxide transistor, sequentially forming a fifth insulating layer and a third conductive layer on the second semi-conductive layer, wherein the third conductive layer includes a gate electrode of at least one oxide transistor;

sequentially forming a sixth insulating layer and an organic layer on the third conductive layer, wherein the sixth insulating layer is provided with a plurality of vias and a plurality of grooves, the plurality of vias respectively expose the active layers of the polysilicon transistor and the oxide transistor, the orthographic projection of the plurality of grooves on the substrate is not overlapped with the orthographic projection of the plurality of vias on the substrate, and the organic layer fills the grooves.

In an exemplary embodiment, forming a sixth insulating layer on the third conductive layer includes:

depositing a sixth insulating thin film, and performing a first etching process on the sixth insulating thin film to form a first groove group;

performing a second etching process on the sixth insulating thin film to form a first via group and a second groove group; the first via group exposes both ends of the active layer of the polysilicon transistor, and the orthographic projection of the first groove group on the substrate is overlapped with the orthographic projection of the gate electrode of the polysilicon transistor on the substrate, and the first groove group exposes the third insulating layer on the gate electrode of the polysilicon transistor; and performing a third etching process for the sixth insulating thin film to form a second via group and a third groove group, wherein the second via group exposes both ends of the active layer of the oxide transistor, and the orthographic projection of the second groove group and the third groove group on the substrate is not overlapped with the orthographic projection of the gate electrode of the polysilicon transistor on the substrate.

In an exemplary embodiment, the polysilicon transistor includes a first transistor, a second transistor, a third transistor, a fourth transistor, a fifth transistor, a sixth transistor and a seventh transistor, and the oxide transistor includes an eighth transistor;

the display substrate includes a plurality of sub-pixels, wherein the sub-pixels include a first region, a second region and a third region, and the second region is disposed between the first region and the third region;

the first transistor, the second transistor, the fourth transistor and the eighth transistor are disposed in the first region;

the third transistor and the storage capacitor are disposed in the second region; and the fifth transistor, the sixth transistor and the seventh transistor are disposed in the third region.

An exemplary embodiment of the present disclosure further provides a display apparatus, which includes the display substrate in the above embodiments. The display apparatus may be any product or component with a display function, such as a mobile phone, a tablet computer, a television, a display, a notebook computer, a digital photo frame, a navigator, an advertising panel, a smart watch, an E-book portable multimedia player, or a display screen of various products of Internet of Things. In an exemplary implementation, the display apparatus may be a wearable display apparatus that a human body may wear in some manners, such as a smart watch and a smart bracelet.

The drawings of the present disclosure only involve the structures involved in the present disclosure, and the other structures may refer to conventional designs. The embodiments in the present disclosure, i.e., the features in the embodiments, can be combined in a case of no conflicts to obtain new embodiments.

Those of ordinary skill in the art should know that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, wherein in a direction perpendicular to the display substrate, the display substrate comprises:

a substrate, and a first semi-conductive layer, a first conductive layer, a second conductive layer, a second semi-conductive layer, a third conductive layer, an interlayer insulating layer and an organic layer stacked on the substrate, wherein the first semi-conductive layer comprises an active layer of at least one polysilicon transistor, the first conductive layer comprises a gate electrode of at least one polysilicon transistor and a first electrode plate of a storage capacitor, the second conductive layer comprises a second electrode plate of a storage capacitor, the second semi-conductive layer comprises an active layer of at least one oxide transistor, and the third conductive layer comprises a gate electrode of at least one oxide transistor;

wherein the interlayer insulating layer is provided with a plurality of vias and a plurality of grooves, there is at least an overlapping region between an orthographic projection of the plurality of vias on the substrate and an orthographic projection of at least one of the first semi-conductive layer, the first conductive layer, the second conductive layer, the second semi-conductive layer and the third conductive layer on the substrate, and the plurality of grooves are filled with the organic layer;

wherein the polysilicon transistor comprises a first transistor, a second transistor, a third transistor, a fourth transistor, a fifth transistor, a sixth transistor and a seventh transistor, and the oxide transistor comprises an eighth transistor;

wherein the display substrate comprises a plurality of sub-pixels, wherein the sub-pixels comprise a first region, a second region and a third region, and the second region is disposed between the first region and the third region;

wherein the plurality of grooves comprises a fourth groove; and wherein the fourth groove is disposed in the second region, and there is at least an overlapping region between an orthographic projection of the fourth groove on the substrate and an orthographic projection of an active layer of the fourth transistor on the substrate; and there is at least an overlapping region between the orthographic projection of the fourth groove on the substrate and an orthographic projection of the second electrode plate on the substrate.

2. The display substrate of claim 1, wherein there is at least a non-overlapping region between an orthographic projection of the plurality of grooves on the substrate and an orthographic projection of the gate electrode of the oxide transistor on the substrate.

3. The display substrate of claim 1, wherein the plurality of grooves comprises a second groove;

there is at least a non-overlapping region between an orthographic projection of the second groove on the substrate and an orthographic projection of the first semi-conductive layer on the substrate; and there is at least a non-overlapping region between the orthographic projection of the second groove on the substrate and an orthographic projection of the second semi-conductive layer on the substrate.

4. The display substrate of claim 1, wherein:

the first transistor, the second transistor, the fourth transistor and the eighth transistor are disposed in the first region;

the third transistor and the storage capacitor are disposed in the second region; and the fifth transistor, the sixth transistor and the seventh transistor are disposed in the third region.

5. The display substrate of claim 4, wherein the plurality of vias comprise a first via, a second via, a third via, a fourth via, a fifth via, a sixth via, a seventh via and an eighth via;

a second electrode plate of the storage capacitor comprises an opening, and an orthographic projection of the first via on the substrate is within a range of an orthographic projection of the opening on the substrate, and there is at least an overlapping region between the orthographic projection of the first via on the substrate and an orthographic projection of the first electrode plate on the substrate;

an orthographic projection of the second via on the substrate is within a range of an orthographic projection of the second electrode plate on the substrate, and there is at least an overlapping region between the orthographic projection of the second via on the substrate and the orthographic projection of the second electrode plate on the substrate;

there is at least an overlapping region between an orthographic projection of the third via on the substrate and an orthographic projection of a first electrode of the fifth transistor on the substrate;

there is at least an overlapping region between an orthographic projection of the fourth via on the substrate and an orthographic projection of an second electrode of the sixth transistor on the substrate;

there is at least an overlapping region between an orthographic projection of the fifth via on the substrate and an orthographic projection of a first electrode of the fourth transistor on the substrate;

there is at least an overlapping region between an orthographic projection of the sixth via on the substrate and an orthographic projection of a first electrode of the second transistor on the substrate;

there is at least an overlapping region between an orthographic projection of the seventh via on the substrate and an orthographic projection of a first electrode of the seventh transistor on the substrate; and there is at least an overlapping region between an orthographic projection of the eighth via on the substrate and an orthographic projection of a first electrode of the first transistor on the substrate.

6. The display substrate of claim 4, wherein the first conductive layer comprises a first scanning signal line, a second scanning signal line, an light emitting control line and the first electrode plate of the storage capacitor, and the second conductive layer comprises a first shielding layer, the second electrode plate of the storage capacitor and an electrode plate connecting line; the third conductive layer comprises a third scanning signal line and a second initial signal line;

the first scanning signal line, the third scanning signal line and the second initial signal line extend along a first direction and are disposed in the first region;

the first electrode plate, the second electrode plate and the electrode plate connecting line of the storage capacitor are all disposed in the second region; and the second scanning signal line, the light emitting control line and the first shielding layer all extend along the first direction and are disposed in the third region.

7. The display substrate of claim 6, wherein the plurality of vias comprise a ninth via, a tenth via and an eleventh via;

there is at least an overlapping region between an orthographic projection of the ninth via on the substrate and an orthographic projection of the second initial signal line on the substrate;

there is at least an overlapping region between an orthographic projection of the tenth via on the substrate and an orthographic projection of a first electrode of the eighth transistor on the substrate; and there is at least an overlapping region between an orthographic projection of the eleventh via on the substrate and an orthographic projection of a second electrode of the eighth transistor on the substrate.

8. The display substrate of claim 6, wherein the plurality of grooves comprises a third groove;

the third groove is disposed in the second region, and there is at least an overlapping region between an orthographic projection of the third groove on the substrate and an orthographic projection of an active layer of the third transistor on the substrate; and there is at least an overlapping region between an orthographic projection of the third groove on the substrate and orthographic projections of the second electrode plate and the electrode plate connecting line on the substrate.

9. The display substrate of claim 8, wherein the third groove is further disposed in the third region, and there is at least an overlapping region between the orthographic projection of the third groove on the substrate and an orthographic projection of an active layer of the sixth transistor on the substrate; and there is at least an overlapping region between the orthographic projection of the third groove on the substrate and an orthographic projection of the light emitting control line on the substrate.

10. The display substrate according to claim 9, wherein there is at least an overlapping region between the orthographic projection of the third groove on the substrate and an orthographic projection of an active layer of the seventh transistor on the substrate; and there is at least an overlapping region between the orthographic projection of the third groove on the substrate and an orthographic projection of the second scanning signal line on the substrate.

11. The display substrate of claim 6, wherein the plurality of grooves comprises a fifth groove;

the fifth groove is disposed in the third region, and there is at least an overlapping region between an orthographic projection of the fifth groove on the substrate and an orthographic projection of an active layer of the fifth transistor on the substrate; and there is at least an overlapping region between the orthographic projection of the fifth groove on the substrate and an orthographic projection of the light emitting control line on the substrate.

12. The display substrate of claim 6, wherein the plurality of grooves comprises a sixth groove;

there is at least an overlapping region between an orthographic projection of the sixth groove on the substrate and an orthographic projection of the second scanning signal line on the substrate.

13. The display substrate of claim 6, wherein the plurality of grooves comprises a seventh groove;

there is at least an overlapping region between an orthographic projection of the seventh groove on the substrate and orthographic projections of the first scanning signal line and the light emitting control line on the substrate.

14. The display substrate of claim 6, wherein the plurality of grooves comprises an eighth groove;

the eighth groove is disposed in the third region, and there is at least a non-overlapping region between an orthographic projection of the eighth groove on the substrate and an orthographic projection of the first semi-conductive layer on the substrate; there is at least an overlapping region between the orthographic projection of the eighth groove on the substrate and an orthographic projection of the light emitting control line on the substrate; and there is at least an overlapping region between the orthographic projection of the eighth groove on the substrate and an orthographic projection of the second scanning line on the substrate.

15. The display substrate of claim 14, wherein the plurality of grooves comprises a thirteenth groove;

the thirteenth groove is disposed in the third region, and there is at least an overlapping region between an orthographic projection of the thirteenth groove on the substrate and the orthographic projection of the eighth groove on the substrate.

16. The display substrate of claim 6, wherein the display substrate further comprises a fourth conductive layer disposed on the organic layer, wherein the fourth conductive layer comprises a power connecting line, a first initial signal line, a fifth connection electrode, a sixth connection electrode, a seventh connection electrode, an eighth connection electrode and a ninth connection electrode;

a gate electrode of the first transistor is connected with the second scanning signal line, a first electrode of the first transistor is connected with the second initial signal line through the ninth connection electrode and a via, and a second electrode of the first transistor and a first electrode of the second transistor are connected with a first electrode of an eighth transistor through the sixth connection electrode and a via; a gate electrode of the second transistor is connected with the first scanning signal line; the first electrode plate of the storage capacitor and a gate electrode of the third transistor are connected with a second electrode of the eighth transistor through the fifth connection electrode and a via, and the second electrode plate of the storage capacitor is connected with a first power supply line through the power connecting line; a first electrode of the third transistor, a second electrode of the fourth transistor and a second electrode of the fifth transistor are connected into an integrated structure, and a second electrode of a third transistor, a second electrode of a second transistor and a first electrode of a sixth transistor are connected into an integrated structure; a gate electrode of the fourth transistor is connected with a first scanning signal line, and a first electrode of the fourth transistor is connected with a data signal line through the eighth connection electrode and a via; a gate electrode of the fifth transistor is connected with an light emitting control signal line, and a first electrode of the fifth transistor is connected with a first power supply line; a gate electrode of the sixth transistor is connected with the light emitting control signal line, and a second electrode of the sixth transistor and a second electrode of the seventh transistor are connected through the seventh connection electrode and a via; a gate electrode of the seventh transistor is connected with the first scanning signal line, and a first electrode of the seventh transistor is connected with the first initial signal line; and a gate electrode of the eighth transistor is connected with the third scanning signal line.

17. The display substrate of claim 16, wherein the plurality of grooves comprises a ninth groove;

the ninth groove is disposed in a first region, and there is at least an overlapping region between an orthographic projection of the ninth groove on the substrate and an orthographic projection of the second initial signal line on the substrate.

18. A display apparatus, comprising the display substrate of claim 1.

19. A method for preparing a display substrate, comprising:

forming a first semi-conductive layer on a substrate, wherein the first semi-conductive layer comprises an active layer of at least one polysilicon transistor;

forming a first conductive layer on the first semi-conductive layer, wherein the first conductive layer comprises at least a gate electrode of the polysilicon transistor and a first electrode plate of a storage capacitor;

forming a second conductive layer on the first conductive layer, wherein the second conductive layer comprises a second electrode plate of the storage capacitor;

forming a second semi-conductive layer on the second conductive layer, wherein the second semi-conductive layer comprises an active layer of at least one oxide transistor;

forming a third conductive layer on the second semi-conductive layer, wherein the third conductive layer comprises a gate electrode of at least one oxide transistor; and sequentially forming an interlayer insulating layer and an organic layer on the third conductive layer, wherein the interlayer insulating layer is provided with a plurality of vias and a plurality of grooves, there is at least an overlapping region between an orthographic projection of the vias on the substrate and an orthographic projection of at least one of the first semi-conductive layer, the first conductive layer, the second conductive layer, the second semi-conductive layer and the third conductive layer on the substrate, and the plurality of grooves are filled with the organic layer, wherein the polysilicon transistor comprises a first transistor, a second transistor, a third transistor, a fourth transistor, a fifth transistor, a sixth transistor and a seventh transistor, and the oxide transistor comprises an eighth transistor;

wherein the display substrate comprises a plurality of sub-pixels, wherein the sub-pixels comprise a first region, a second region and a third region, and the second region is disposed between the first region and the third region;

wherein the plurality of grooves comprises a fourth groove; and wherein the fourth groove is disposed in the second region, and there is at least an overlapping region between an orthographic projection of the fourth groove on the substrate and an orthographic projection of an active layer of the fourth transistor on the substrate; and there is at least an overlapping region between the orthographic projection of the fourth groove on the substrate and an orthographic projection of the second electrode plate on the substrate.

\* \* \* \* \*